(12) United States Patent
Eguchi et al.

(10) Patent No.: US 6,461,581 B1
(45) Date of Patent: Oct. 8, 2002

(54) CLATHRATE COMPOUNDS AND MANUFACTURING METHOD THEREOF

(75) Inventors: Haruki Eguchi, Tokyo (JP); Akihiko Suzuki, Souka (JP); Satoshi Takahashi, Yokohama (JP); Kaoru Miyahara, Ichikawa (JP); Tohru Tanaka, Matsudo (JP); Shigemitsu Kihara, Tachikawa (JP); Kazuo Tsumuraya, Atsugi (JP)

(73) Assignees: Ishikawajima-Harima Heavy Industries Co., Ltd., Tokyo (JP); Kazuo Tsumuraya, Kanagawa-ken (JP)

( * ) Notice: Subject to any disclaimer, the term of this patent is extended or adjusted under 35 U.S.C. 154(b) by 1 day.

(21) Appl. No.: 09/631,176

(22) Filed: Aug. 2, 2000

(30) Foreign Application Priority Data

| Aug. 3, 1999 | (JP) | ............................................ 11-220567 |
| Aug. 3, 1999 | (JP) | ............................................ 11-220568 |
| Mar. 28, 2000 | (JP) | ...................................... 2000-089819 |
| May 24, 2000 | (JP) | ...................................... 2000-153760 |

(51) Int. Cl.⁷ .......................... C01B 31/00; C01B 33/00
(52) U.S. Cl. .............................. 423/324; 423/1; 423/3; 423/21.1; 423/22; 423/23; 423/49; 423/53; 423/62; 423/69; 423/87; 423/99; 423/111; 423/138; 423/155; 423/179; 423/276; 423/299; 423/351; 423/414; 423/462; 423/508; 423/511; 423/579
(58) Field of Search .............................. 136/236.1, 237; 252/62.37; 423/324, 414, 1, 3, 21.1, 22, 23, 49, 53, 62, 69, 87, 99, 111, 138, 155, 179, 276, 299, 351, 462, 508, 511, 579

(56) References Cited

U.S. PATENT DOCUMENTS 5,800,794 A * 9/1998 Tanigaki et al. ............ 423/324
6,188,011 B1 * 2/2001 Nolas et al. ............. 136/236.1

FOREIGN PATENT DOCUMENTS

| EP | 0 781 727 A1 | 7/1997 |
| JP | 9183607 A * | 7/1997 |

(List continued on next page.)

OTHER PUBLICATIONS

G.S. Nolas et al., "Semiconducting GE Clathrates: Promising Candidates for Thermoelectric Applications", Jul. 13, 1998, Applied Physics Letters, vol. 73, no. 2, pp. 178–180.

(List continued on next page.)

Primary Examiner—Stanley S. Silverman
Assistant Examiner—Timothy C Vanoy
(74) Attorney, Agent, or Firm—Pearne & Gordon LLP

(57) ABSTRACT

The present invention provides a clathrate compound which can be used as a thermoelectric material, a hard material, or a semiconductor material. Silicon or carbon are formed into a clathrate lattice, and a clathrate compound is then formed in which specified doping atoms are encapsulated within the clathrate lattice, and a portion of the atoms of the clathrate lattice are substituted with specified substitution atoms. The clathrate lattice is, for example, a silicon clathrate 34 ($Si_{34}$) mixed lattice of a $Si_{20}$ cluster including a dodecahedron of Si atoms, and a $Si_{28}$ cluster including a hexahedron of Si atoms. Suitable doping atoms are atoms from group 1A, group 2A, group 3A, group 1B, group 2B, group 3B, group 4A, group 5A, group 6A, and group 8, and suitable substitution atoms are atoms from group 1A, group 2A, group 3A, group 1B, group 2B, group 3B, group 5A, group 6A, group 7A, group 5B, group 6B, group 7B, and group 8 of the periodic table. Suitable manufacturing methods include melt methods and sintering methods, and moreover intercalant intercalation compounds or the like may also be used as raw materials.

7 Claims, 16 Drawing Sheets

FOREIGN PATENT DOCUMENTS

| | | | | |
|---|---|---|---|---|
| JP | 9202609 | A | * | 8/1997 |
| JP | 11026825 | A | * | 1/1999 |
| JP | 11343110 | A | * | 12/1999 |

OTHER PUBLICATIONS

Ganesh K. Ramachandran et al., "Synthesis and X-Ray Characterization of Silicon Clathrates", Jul. 1999, Journal of Solid State Chemistry, vol. 145, No. 2, pp. 716–730.

Shoji Yamanaka et al., "Preparation of Barium-Containing Silicon Clathrate Compound", 1995, Fullerene Science & Technology, vol. 3, No. 1, pp. 21–28.

Copy of the Periodic Table of the Elements Published by VWR Scientific Products, P.O. Box 5229, Buffalo Grove Illinois 60089–5229; copyright 1998, Catalog No. WLS–18806.*

* cited by examiner

Fig. 16

| | 1A | 2A | 3A | 4A | 5A | 6A | 7A | 8 | | | 1B | 2B | 3B | 4B | 5B | 6B | 7B |
|---|---|---|---|---|---|---|---|---|---|---|---|---|---|---|---|---|---|
| | H 2.1 | | | | | | | | | | | | | | | | |
| | Li 1.0 | Be 1.6 | | | | | | | | | | | | | | | |
| | Na 0.9 | Mg 1.3 | | | | | | | | | | | | B 2.0 | C 2.6 | N 3.0 | O 3.4 | F 4.0 |
| | | | | | | | | | | | | | Al 1.6 | Si 1.9 | P 2.2 | S 2.6 | Cl 3.2 |
| | K 0.8 | Ca 1.0 | Sc 1.4 | Ti 1.5 | V 1.6 | Cr 1.7 | Mn 1.6 | Fe 1.8 | Co 1.9 | Ni 1.9 | Cu 1.9 | Zn 1.7 | Ga 1.8 | Ge 2.0 | As 2.2 | Se 2.6 | Br 3.0 |
| | Rb 0.8 | Sr 1.0 | Y 1.2 | Zr 1.3 | Nb 1.6 | Mo 2.2 | Tc 1.9 | Ru 2.2 | Rh 2.3 | Pd 2.2 | Ag 1.9 | Cd 1.7 | In 1.8 | Sn 2.0 | Sb 2.1 | Te 2.1 | I 2.7 |
| | Cs 0.8 | Ba 0.9 | La 1.1 | Hf 1.3 | Ta 1.5 | W 2.4 | Re 1.9 | Os 2.2 | Ir 2.2 | Pt 2.3 | Au 2.5 | Hg 2.0 | Tl 2.0 | Pb 2.3 | Bi 2.0 | Po 2.0 | At 2.2 |
| | Fr 0.7 | Ra 0.9 | Ac 1.1 | Th 1.3 | Pa 1.5 | U 1.4 | | | | | | | | | | | |

CLATHRATE COMPOUNDS AND MANUFACTURING METHOD THEREOF

BACKGROUND OF THE INVENTION

1. Field of the Invention

The present invention relates to clathrate compounds, high efficiency thermoelectric materials and thermoelectric modules utilizing the clathrate compound, the semiconductor materials or hard materials utilizing the clathrate compounds, as well as manufacturing methods thereof.

2. Description of the Related Art

Recently, in high-tech fields such as electronics, the development of new high performance materials which differ greatly from conventional materials has received much attention.

For example, various methods for using thermoelectric materials are under investigation, but conventional thermoelectric materials display poor thermoelectric conversion efficiency, and are limited to certain uses where reliability is not particularly important. Consequently, it has been deemed problematic to propose the use of thermoelectric materials for typical uses such as waste heat power generation.

Furthermore, in order to improve the efficiency of these type of thermoelectric materials and enable their use as high efficiency thermoelectric materials, the following types of conditions need to be satisfied.

(1) a low thermal conductivity
(2) a high Seebeck coefficient
(3) a high electrical conductivity However, the technique employed for developing conventional thermoelectric materials has involved selecting a composition based on experience, and then pursuing development of that material. As a result, the only example of a thermoelectric material currently being developed, for which the value of the dimensionless figure of merit (ZT) is greater than 1 at temperatures above 700 K, is the p-type thermoelectric material GeTe—AgSbTe$_2$.

Furthermore in the semiconductor field, laser devices, which are essential to optical communication technology, use silicon (Si), germanium (Ge), or group III-V compound semiconductors such as gallium arsenide (GaAs). Because the temperature range for stable operation of this type of compound semiconductors is low, and ensuring good heat dissipation is a large problem, the development of the semiconductors which will also operate at higher temperatures has been greatly needed.

Furthermore, in the case of short wavelength laser emission devices required for use in high density recordings such as optical disks and digital video disks (DVD), semiconductors with a wide forbidden bandwidth are used. Examples of this type of wide forbidden bandwidth (wide gap) semiconductors include ZnS, ZnSe, GaN, SiC and diamond.

The emission wavelength of a semiconductor laser device is determined by the inherent forbidden bandwidth of the semiconductor materials, and if the emission wavelength and the forbidden bandwidth are termed λ (nm) and Eg (eV) respectively, then the relationship is described by the equation (1) below.

$$\lambda(nm) = 1240/Eg(eV) \qquad (1)$$

The visible light region is between wavelengths of 380~760 nm, and the corresponding forbidden bandwidth is 1.63~3.26 eV. Conventionally, emission devices emitting green light and light further towards the red end of the spectrum, with wavelengths of at least 550 nm, have used group II-V compound semiconductors with a forbidden bandwidth of no more than 2 eV, such as GaP, GaAs, or GaAlAs.

However, in order to generate a blue light emission device with a wavelength of less than 500 nm, then from the relationship shown in equation (1) it is clear that a wide forbidden bandwidth (wide gap) semiconductor with a forbidden bandwidth of at least 2.5 eV is required. Examples of this type of wide gap semiconductor include group II-VI compound semiconductors such as ZnS (forbidden bandwidth: 3.39 eV) and ZnSe (forbidden bandwidth: 3.39 eV), group III-V compound semiconductors such as GaN (forbidden bandwidth: 3.39 eV), and SiC (forbidden bandwidth: 3.39 eV).

Furthermore in the field of hard materials, although diamond is widely used, because of the associated high cost, an alternative hard material has been sought after. Although cubic boron nitride (CBN) is able to be synthesized, it remains limited to applications such as abrasive grits, and a material which can be used for members in mechanical components and sliding components which require low friction and good abrasion resistance has been keenly sought.

If conventional materials are considered within the background described above, then first it is true to say that a thermoelectric material which satisfies all the requirements for a high efficiency thermoelectric material has not yet appeared. For example in the case of metals, although offering the benefits of a large electrical conductivity, they suffer from having a large thermal conductivity and a small Seebeck coefficient. In the case of semiconductors, although offering the advantages of a small thermal conductivity and a large Seebeck coefficient, because the electrical conductivity is small, they can not be considered a high efficiency thermoelectric materials. Furthermore it is known that BiTe is used as a thermoelectric material at around room temperature. However, the efficiency thereof at 100° C. or higher is low, and it is unable to withstand practical use.

Furthermore, in order to use a thermoelectric material in typical power generation, a power generation system must be constructed by combining a p-type thermoelectric material and an n-type thermoelectric material. However, in the case of the aforementioned conventional thermoelectric material of GeTe—AgSbTe$_2$, an n-type material does not exist.

In contrast, with conventional semiconductor materials, the temperature range for stable operation is low, meaning the operating environment is limited to a thermal environment close to room temperature.

Conventionally, heat generation has been suppressed in order to achieve stable operation of a semiconductor device, and so a large heat radiator has been necessary. For example, widely used silicon devices typically have a stable operating temperature range below 125° C., and so electronic equipment utilizing silicon devices has required large heat sinks. Even with the use of heat sinks, the stable operating temperature range for a silicon device is, at the most, no more than 200° C., and currently semiconductor devices do not exist which are capable of withstanding use in fields such as automobile components, high temperature gas sensors, engine control sections of space rockets, underground detection measuring apparatus, and nuclear power applications. The circumstances are the same for compound semiconductors.

Furthermore, in order to use a compound as a semiconductor, a doping atom must be introduced to make the conductivity either p-type or n-type. However, in order to introduce a p-type or n-type doping atom into GaN or SiC, a new artificial superlattice structuring is necessary, which makes the crystal growth process difficult. Furthermore, ZnS suffers from an additional problem in that the crystals cannot be obtained cheaply. In addition, in the case of diamond, control of the doping atoms is problematic.

As a result, the reality is that a semiconductor with a wide forbidden bandwidth which can be operated stably under conditions of high temperature or high pressure is not currently available.

In addition, conventional methods of manufacturing clathrate compounds include a method disclosed in Japanese Unexamined Patent Application, First Publication No. Hei-9-183607, wherein a monoclinic system crystal is produced by heating a mixture of an element from group 4B of the periodic table and an alkali metal under an atmosphere of argon, while a cubic system crystal is produced by heating a mixture of an element from group 4B of the periodic table and an alkali earth metal under an atmosphere of argon, and the following mixing of the monoclinic system crystal and the cubic system crystal and subsequent heating to form a precursor comprising a ternary solid solution, this precursor was heated under reduced pressure to effect an alkali metal element distillation and produce the clathrate compound. According to this method, the production process is complex, and moreover because the clathrate compound is synthesized under conditions of reduced pressure, the rate of formation is slow and the yield is also poor.

Furthermore another method of manufacturing clathrate compounds is disclosed in Japanese Unexamined Patent Application, First Publication No. Hei-9-202609, wherein a diamond anvil type high pressure apparatus is used, and graphite is subjected to 14,000 Mpa of pressure at room temperature for a period of one week to synthesize a clathrate compound. According to this method, because the clathrate compound is synthesized at room temperature, the rate of formation is slow and the yield is also poor.

However, the conventional methods described above either require a considerable length of time, or are complex resulting in a difficult synthesis, and moreover the yields are poor and only thin films have been successfully synthesized, and in fact the current reality is that no practical and viable method of producing clathrate compounds exists.

BRIEF SUMMARY OF THE INVENTION

The present invention takes the above circumstances into consideration, with an object of providing a clathrate compound which displays promise as a high efficiency thermoelectric material, meeting the three conditions of a low thermal conductivity, a high Seebeck coefficient and a high electrical conductivity, and with a figure of merit which exceeds 1.

Another object of the present invention is to provide a superior thermoelectric material and thermoelectric module which may be used in typical applications such as waste heat power generation.

Furthermore, yet another object of the present invention is to provide a clathrate compound which may be used as a superior wide gap semiconductor which can be operated stably even under conditions of high temperature or high pressure. This type of wide gap semiconductor is ideal for applications such as blue light emission devices.

Furthermore, yet another object of the present invention is to provide a clathrate compound which may be used as a hard material in mechanical components and sliding components and the like, which require low friction and good abrasion resistance.

Yet another object of the present invention is to provide a simple and high yielding method of manufacturing, in bulk, a clathrate compound which displays the superior characteristics sought after in the various fields of application described above.

A clathrate compound of the present invention comprises a clathrate lattice with atoms of at least one element from group 4B of the periodic table as the main structure, doping atoms which are encapsulated within the lattice spacing of the clathrate lattice, and substitution atoms which are substituted for at least one portion of the atoms which make up the clathrate lattice. The doping atoms of the clathrate compound are atoms of at least one of the elements from group 1A, group 2A, group 3A, group 1B, group 2B, group 3B, group 4A, group 5A, group 6A, and group 8 of the periodic table, and the substitution atoms are atoms of at least one of the elements from group 1A, group 2A, group 3A, group 1B, group 2B, group 3B, group 5A, group 6A, group 7A, group 5B, group 6B, group 7B, and group 8 of the periodic table.

A clathrate compound of this type displays various superior physical, mechanical and electrical characteristics, and may consequently be used as a thermoelectric material, a semiconductor material, and a hard material.

In a clathrate compound of the present invention, it is preferable that the aforementioned doping atoms have a greater mass than the atoms which make up the aforementioned clathrate lattice. This suppresses vibration of the clathrate lattice atoms, and diffuses lattice vibrations thereby reducing the thermal conductivity, meaning the clathrate compound will display favourable characteristics as a thermoelectric material.

Furthermore, in a clathrate compound of the present invention, it is also preferable that the doping atoms have a smaller electronegativity than the atoms which make up the aforementioned clathrate lattice. This means electrons from the outermost shell of a doping atom can move readily to the atoms which make up the clathrate lattice, so that the overall compound displays metal-like characteristics, and displays favourable characteristics as a semiconductor material.

The present invention is a thermoelectric material made from the aforementioned clathrate compound. The thermoelectric material of the present invention has a low thermal conductivity, a high electrical conductivity, and a high Seebeck coefficient.

Furthermore, the present invention is also a thermoelectric module which utilizes a thermoelectric material made from the aforementioned clathrate compound. A thermoelectric module of the present invention has a low thermal conductivity and a high electrical conductivity, and also displays a superior Seebeck coefficient and figure of merit.

In addition the present invention is also a semiconductor material made from the aforementioned clathrate compound. A semiconductor material of the present invention has a wide forbidden bandwidth, and displays stable operation even at high temperatures.

In addition, the present invention is also a hard material made from the aforementioned clathrate compound. A hard material of the present invention has a hardness second only to that of diamond, and is able to be produced as a bulk material.

According to the present invention, a clathrate lattice described above may utilize a clathrate compound, silicon clathrate 46 ($Si_{46}$), which is a mixed lattice of a $Si_{20}$ cluster comprising a dodecahedron of Si atoms, and a $Si_{24}$ cluster comprising a tetradecahedron of Si atoms.

According to the present invention, the aforementioned clathrate lattice may also utilize a clathrate compound, silicon clathrate 34 ($Si_{34}$), which is a mixed lattice of a $Si_{20}$ cluster comprising a dodecahedron of Si atoms, and a $Si_{28}$ cluster comprising a hexadecahedron of Si atoms.

In addition, according to the present invention, the aforementioned clathrate lattice may also utilize a clathrate compound, carbon clathrate 46 ($C_{46}$), which is a mixed lattice of a $C_{20}$ cluster comprising a dodecahedron of C atoms, and a $C_{24}$ cluster comprising a tetradecahedron of C atoms.

Furthermore, according to the present invention, the aforementioned clathrate lattice may also utilize a clathrate compound, carbon clathrate 34 ($C_{34}$), which is a mixed lattice of a $C_{20}$ cluster comprising a dodecahedron of C atoms, and a $C_{28}$ cluster comprising a hexadecahedron of C atoms.

A first method of manufacturing a clathrate compound according to the present invention si a method wherein an elementary substance of the atoms required for constructing the aforementioned clathrate lattice, an elementary substance of the aforementioned doping atoms, and an elementary substance of the aforementioned substitution atoms are mixed together in a predetermined ratio, and following pressure formation into a desired form, are subjected to preliminary heat treatment, and then sintered using pressure sintering techniques to from the clathrate compound.

A second method of manufacturing a clathrate compound according to the present invention is a method wherein a compound of a group 4B element from the periodic table which incorporates at least one element to become the doping atoms and the substitution atoms is melted in an inert atmosphere, and following solidification, is cooled gradually, maintained at a temperature of at least 500° C. for a period of at least 10 hours, and is then cooled further, before being washed to remove any excess doping atoms and substitution atoms, and subsequently pressure sintered (hot press or the like) to form the clathrate compound.

Because the raw materials are melted at high temperatures, the above method offers the advantages that the reaction proceeds reliably, the yield is good, and the product can be obtained in a relatively short time.

A third method of manufacturing a clathrate compound according to the present invention is a method wherein a compound of a group 4B element from the periodic table which incorporates at least one element to become the doping atoms and the substitution atoms is crushed, in an inert atmosphere, to a powder with a granular diameter of no more than 100 $\mu$m, and is then spread into a thin film inside a heat resistant vessel and left to stand, and the following heating at a temperature of at least 500° C. for a period of at least 10 hours, is then cooled, washed to remove any excess doping atoms and substitution atoms, and subsequently pressure sintered to form the clathrate compound.

Although requiring a long time for the synthesis reaction, large scale equipment is unnecessary and the method of manufacture is simple.

A fourth method of manufacturing a clathrate compound according to the present invention is a method wherein a fine powder of an intercalant graphite intercalation compound with a granular diameter of no more than 100 $\mu$m and incorporating at least one element to become the doping atoms and the substitution atoms is spread into a thin film inside a heat resistant vessel and then left to stand, and the following heating at a temperature of at least 500° C. for a period of at least 10 hours, is then cooled, washed to remove any excess doping atoms and substitution atoms, and subsequently pressure sintered to form the clathrate compound.

This method offers the advantage that because the element or elements of the doping atoms and substitution atoms are already incorporated within the intercalant graphite intercalation compound, doping and substitution can be conducted extremely easily.

The effects of the present invention are as described below.

A clathrate compound according to the present invention has properties resembling those of a metal, displaying favourable thermal conductivity, electrical conductivity and semiconductor like properties, and also possessing a high level of hardness.

A clathrate compound according to the present invention displays excellent applicability as a thermoelectric material, a semiconductor material, or a hard material.

Furthermore, with a method of manufacturing a clathrate compound according to the present invention, a superior clathrate compound which has properties resembling those of a metal, displays favourable thermal conductivity, electrical conductivity and semiconductor like properties, and also possesses a high level of hardness, can be obtained simply and with a good yield, through a comparatively simple manufacturing method.

That is, a clathrate compound of the present invention enables the provision of bulk hard materials, for which the incorporation of impurities is relatively simple in comparison with diamond.

Furthermore, a clathrate compound according to the present invention has a low thermal conductivity and a high electrical conductivity, and so is able to be used as a high efficiency thermoelectric material.

In addition, in the clathrate compounds according to the present invention, by controlling the impurity elements introduced and adjusting the energy band of the band gap, semiconductors with a wide band gap energy level can be obtained, which may be applied to blue light emission laser devices capable of achieving high recording densities. Furthermore, by offering stable operation across a wide temperature range, a clathrate compound of the present invention may also broaden the practical application of semiconductors.

More specifically, a clathrate compound of the present invention comprises a group 4B lattice as the basic clathrate lattice, and because doping atoms are encapsulated inside the clathrate lattice, vibration of the clathrate lattice is suppressed, the thermal conductivity is lowered and the electrical conductivity is increased. Furthermore, as a result of one portion of the atoms which make up the clathrate lattice being substituted with an element with 1~3 valence electrons, the lattice assumes semiconductor-like properties, thereby improving the Seebeck coefficient. Consequently, a material is obtained which is highly suitable as thermoelectric materials, having favourable thermal conductivity and electrical conductivity, and a favourable Seebeck coefficient.

In addition, thermoelectric modules which utilize thermoelectric materials of the present invention have a low thermal conductivity, a high electrical conductivity, and a high Seebeck coefficient, enabling the provision of thermoelectric modules with an excellent figure of merit.

In addition, a semiconductor which utilizes a clathrate compound of the present invention has a basic framework of a group 4B clathrate lattice, and this clathrate lattice is doped with atoms which have a smaller electronegativity than the atoms which make up the lattice, and so the original insulating properties of the clathrate compounds have been shifted closer to metallic properties to yield the properties of a semiconductor. Moreover, by substituting clathrate lattice atoms with atoms which have more, or fewer, valence electrons than the atoms which make up the lattice, p-type or n-type semiconductors can be produced. A clathrate compound semiconductor according to the present invention displays the wide forbidden bandwidth of the clathrate compounds, and so even at high temperatures the amount of leakage current is small, and stable operation can be ensured. Consequently, applications of the present invention to fields such as high temperature gas sensors, automobile control components, engine control components of space rocket engines, control components for nuclear power facilities, and underground detection measuring apparatus are also possible.

Furthermore, because it displays a wide forbidden bandwidth, a clathrate compound semiconductors of the present invention may also be used as a short wavelength blue light laser device.

Furthermore, the first method of manufacturing a clathrate compound semiconductor according to the present invention comprises the simple steps of mixing the simple constituent elements, and then following pressure formation, conducting preliminary heat treatment, and then pressure sintering to produce a clathrate compound with superior characteristics.

Furthermore, with the second method of manufacturing a clathrate compound according to the present invention, the rate of formation of the clathrate compound is faster than conventional manufacturing methods, and the yield is better, resulting in a simple, and efficient synthesis.

Furthermore, with the third method of manufacturing a clathrate compound according to the present invention, because special steps such as the melting step, which takes considerable time, are unnecessary, clathrate compound semiconductors can be obtained very simply.

In addition, the fourth method of manufacturing clathrate compound semiconductors according to the present invention uses an intercalant graphite intercalation compound which already incorporates the doping atoms, and so the formation of the carbon clathrate compound is simple, and the clathrate compound can be produced in a straightforward manner.

BRIEF DESCRIPTION OF THE SEVERAL VIEWS OF THE DRAWING

FIG. 12 is a diagram showing a sample use of the thermoelectric module shown in FIG. 11, wherein

FIG. 16 is a table showing the electronegativity of various atoms.

DETAILED DESCRIPTION OF THE INVENTION

The clathrate compounds according to the present invention comprise a clathrate lattice (a clathrate basic structural unit) constructed from atoms of at least one group 4B element from the periodic table such as C, Si, Ge, and Sn, doping atoms which are encapsulated inside the clathrate lattice by doping, and substitution atoms which are substituted for at least one portion of the plurality of atoms which comprise the clathrate lattice.

(First Embodiment) $Si_{46}$ Compound

Figure 1:
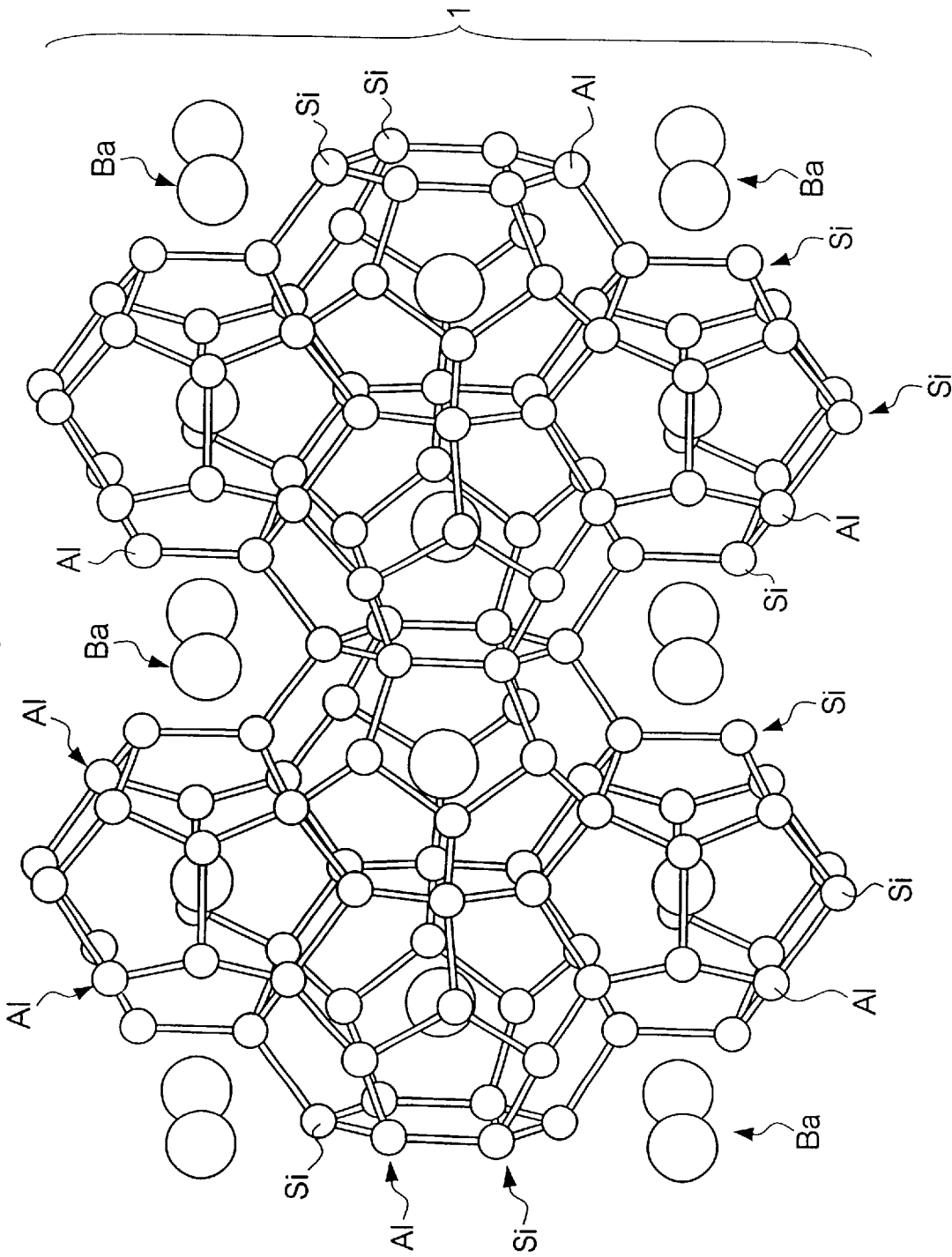
FIG. 1 is a schematic drawing showing the crystal structure of a silicon clathrate 46 according to the present invention.
Figure 2:
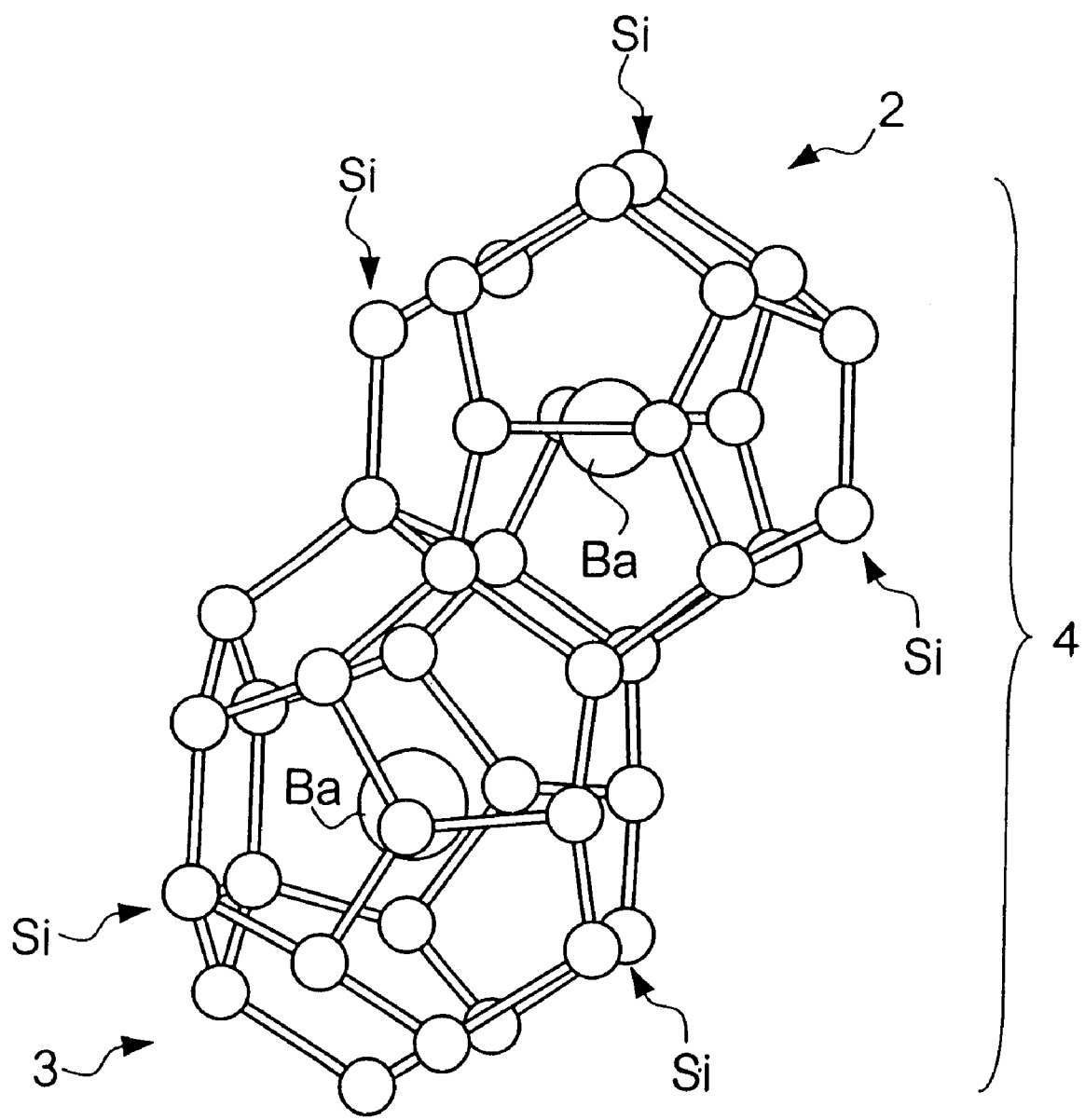
FIG. 2 is a schematic drawing showing a partial structural unit of the silicon clathrate 46 shown in FIG. 1.

FIG. 1 and FIG. 2 show a first embodiment in which a silicon clathrate lattice is applied to the present invention. The silicon clathrate lattice 1 of the first embodiment shown in FIG. 1 comprises a combination of a plurality of structural units 4 shown in FIG. 2, each of which comprises a combination of a $Si_{20}$ cluster 2 made up of a dodecahedron of Si atoms, and a $Si_{24}$ cluster 3 made up of a tetradecahedron of Si atoms.

Furthermore, at least one type of doping atom from group 1A, group 2A, group 3A, group 1B, group 2B, group 3B, group 4A, group 5A, group 6A or group 8 of the periodic table is encapsulated within the silicon clathrate lattice shown in FIG. 1, into at least a portion of the 2a sites of the $Si_{20}$ clusters 2 or the 6d sites of the $Si_{24}$ clusters 3. For example, if a group 2A doping atom is inserted in a 2a site of a $Si_{20}$ cluster, then the group 2A atom will be bivalent, and the two electrons from the atom will move to the atoms comprising the clathrate. As a result, the entire clathrate structure takes on a metallic property.

Furthermore, of the plurality of Si atoms which comprise the silicon clathrate lattice 1, at least a portion of the Si atoms are substituted by any of the atoms from group 1A, group 2A, group 3A, group 1B, group 2B, group 3B, group 5A, group 6A, group 7A, group 5B, group 6B, group 7B or group 8 of the periodic table. The substitution of a portion of the Si atoms by these atoms is performed to suppress or erase the metallic properties (specifically, the high thermal conductivity) of the silicon clathrate lattice 1 which was made metal-like through the prior introduction of doping atoms, and this elemental substitution gives the lattice semiconductor like properties, improving the thermal conductivity and increasing the Seebeck coefficient.

Examples of suitable atoms for the doping of the aforementioned clathrate lattice 1 include group 1A atoms Li, Na, K, Rb, Cs and Fr, and group 2A atoms Be, Mg, Ca, Sr, Ba and Ra. Other examples of suitable doping atoms include group 3A atoms Sc, and Y, lanthanoid elements La, Ce, Pr, Nd, Pm, Sm, Eu, Gd, Tb, Dy, Ho, Er, Tm, Yb and Lu, and actinoid elements Ac, Th, Pa, U, Np, Pu, Am, Cm, Bk, Cf, Es, Fm, Md, No and Lr.

In addition, possible group 1B doping atoms are Cu, Ag and Au, possible group 2B atoms are Zn, Cd and Hg, and possible group 3B atoms are B, Al, Ga, In and Tl.

Furthermore, possible group 4A doping atoms are Ti, Zr, Hf and Th, possible group 5A atoms are V, Nb, Ta and Pa, possible group 6A atoms are Cr, Mo and W, and possible group 8 atoms are the elements Fe, Co, Ni, Ru, Rh, Pd, Os, Ir and Pt. Of these doping atoms, the so-called alkali earth metals of group 2A, Be, Mg, Ca, Sr, Ba and Ra are preferred.

It is preferable if doping is conducted with at least one of these doping elements.

Furthermore, examples of suitable atoms for the substitution of a portion of the atoms of the aforementioned clathrate lattice 1 include group 1A atoms Li, Na, K, Rb, Cs and Fr, and group 2A atoms Be, Mg, Ca, Sr, Ba and Ra. Other examples of suitable substitution atoms include group 3A atoms Sc, and Y, lanthanoid elements La, Ce, Pr, Nd, Pm, Sm, Eu, Gd, Tb, Dy, Ho, Er, Tm, Yb, and Lu, and actinoid elements Ac, Th, Pa, U, Np, Pu, Am, Cm, Bk, Cf, Es, Fm, Md, No and Lr.

In addition, possible group 1B substitution atoms are Cu, Ag and Au, possible group 2B atoms are Zn, Cd and Hg, and possible group 3B atoms are B, Al, Ga, In and Tl.

Furthermore, possible group 5A substitution atoms are V, Nb and Ta, possible group 6A atoms are Cr, Mo and W, and possible group 7A substitution atoms are Mn, Tc and Re.

Possible group 5B substitution atoms are N, P, As, Sb and Bi, possible group 6B atoms are O, S, Se, Te and Po, and possible group 7B substitution atoms are F, Cl, Br, I and At.

In addition, possible group 8 substitution atoms are the elements Fe, Co, Ni, Ru, Rh, Pd, Os, Ir and Pt.

It is preferable that substitution is conducted with at least one, or two or more, of these substitution atoms. Furthermore, of these substitution atoms, substitution using the group 3B atoms of B, Al, Ga, In and Tl, for which compounds are easily formed, is the most preferred option.

The silicon clathrate compound of this first embodiment displays excellent characteristics as thermoelectric materials, semiconductor materials, or hard materials.

(Second Embodiment) $Si_{34}$ Compounds

Figure 3:
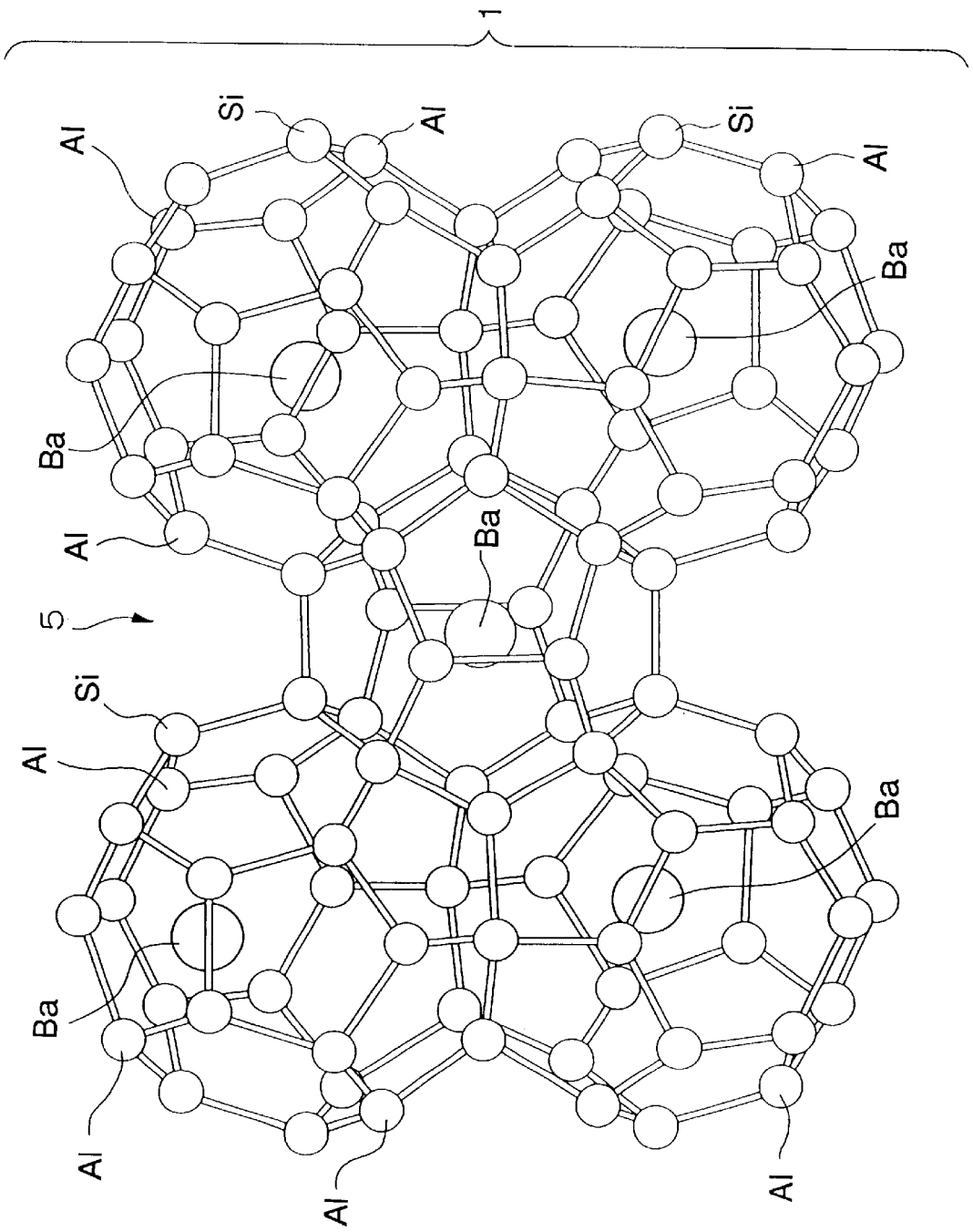
FIG. 3 is a schematic drawing showing the crystal structure of a silicon clathrate 34 according to the present invention.

FIG. 3 is a schematic drawing showing the crystal structure of a silicon clathrate 34 ($Si_{34}$) which comprises the basic structural unit of a second embodiment of a silicon clathrate compound according to the present invention. The silicon clathrate lattice 11 of the silicon clathrate 34 comprises a plurality of structural units 14 shown in FIG. 4, each of which is made from a $Si_{20}$ cluster 2 made up of a dodecahedron of Si atoms and a $Si_{28}$ cluster 13 made up of a hexadecahedron of Si atoms, which are combined to form the silicon clathrate 34 similar to that represented by numeral 11 in FIG. 3.

In the same manner as that described above for the first embodiment, doping atoms from any one of group 1A, group 2A, group 3A, group 1B, group 2B, group 3B, group 4A, group 5A, group 6A or group 8 of the periodic table (Ba from group 2A in the example shown in FIG. 3 and FIG. 4) are encapsulated within the 2a sites of the $Si_{20}$ clusters 2 or the 6d sites of the $Si_{24}$ clusters 3 which make up the silicon clathrate 34 of the second embodiment.

Figure 4:
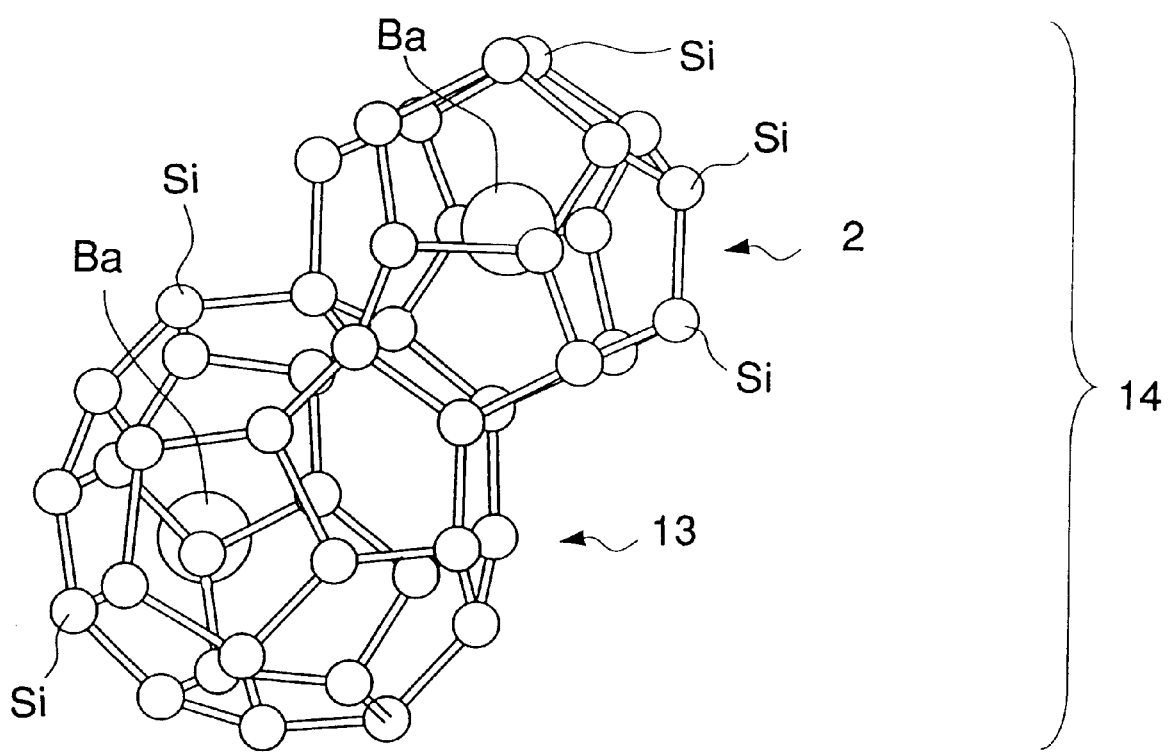
FIG. 4 is a schematic drawing showing a partial structural unit of the silicon clathrate 34 shown in FIG. 3.

In addition, in the same manner as that described above for the first embodiment, a portion of the Si atoms which comprise the silicon clathrate 34 are substituted by any of the atoms from group 1A, group 2A, group 3A, group 1B, group 2B, group 3B, group 5A, group 6A, group 7A, or group 8 of the periodic table (Al from group 3B in the example shown in FIG. 3 and FIG. 4).

As was observed for the clathrate compound of the first embodiment, the silicon clathrate compound of the second embodiment displays excellent characteristics as thermoelectric materials, semiconductor materials, or hard materials.

(Third Embodiment) $C_{46}$ Compounds

Figure 5:
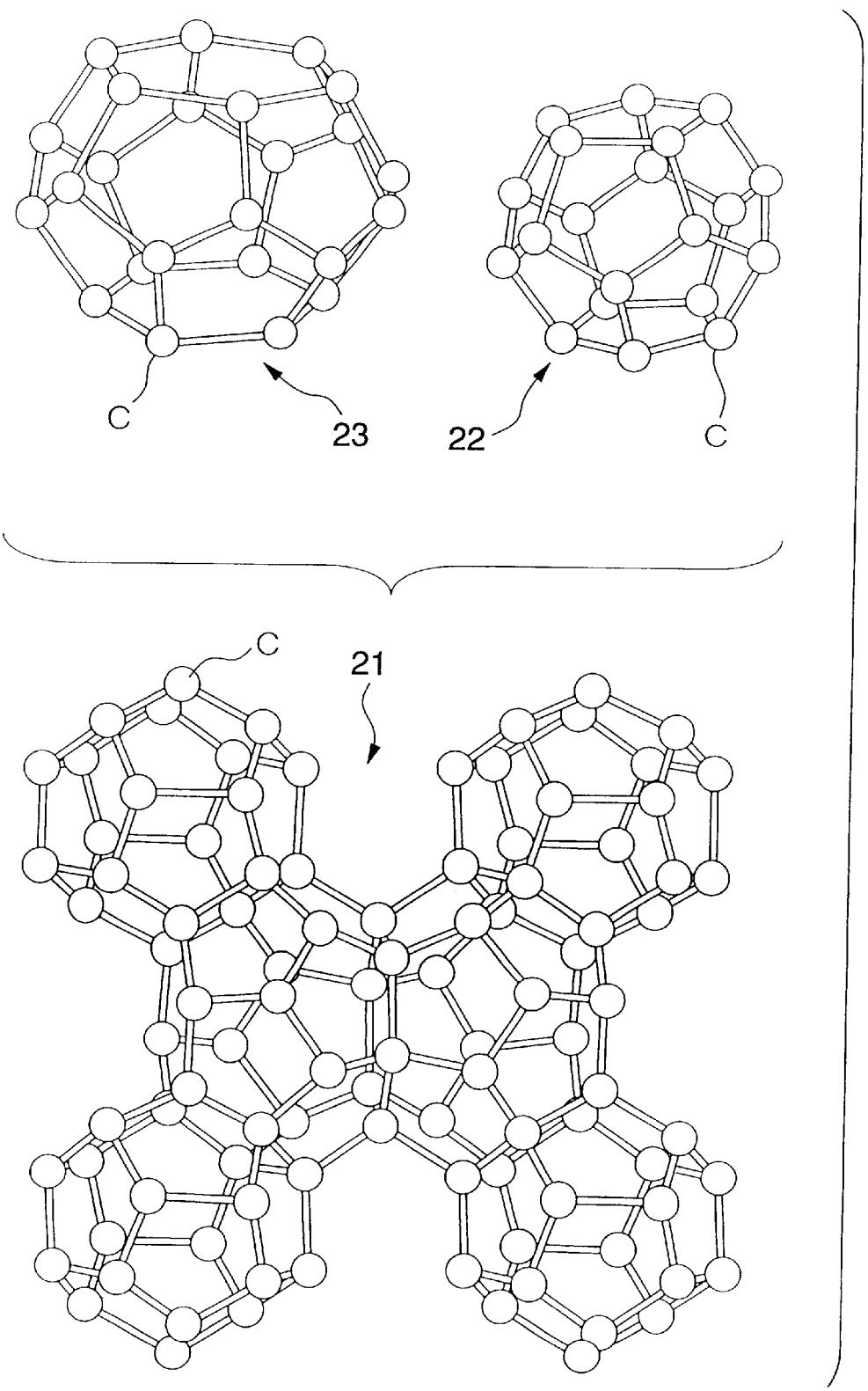
FIG. 5 is a diagram describing the formation process for a carbon clathrate 46.

For clathrate compounds of the present invention, the clathrate lattices described above may also be carbon (C) clathrate lattices. In such cases, the doping atoms and substitution atoms are the same as those described above for silicon clathrate compounds. In the case of carbon clathrate compounds, a carbon clathrate 46 may be used, which is a mixed lattice of a $C_{20}$ cluster made up of a dodecahedron of C atoms, and a $C_{24}$ cluster made up of a tetradecahedron of C atoms. FIG. 5 shows a schematic representation of a formation process for the carbon clathrate 46.

Figure 6:
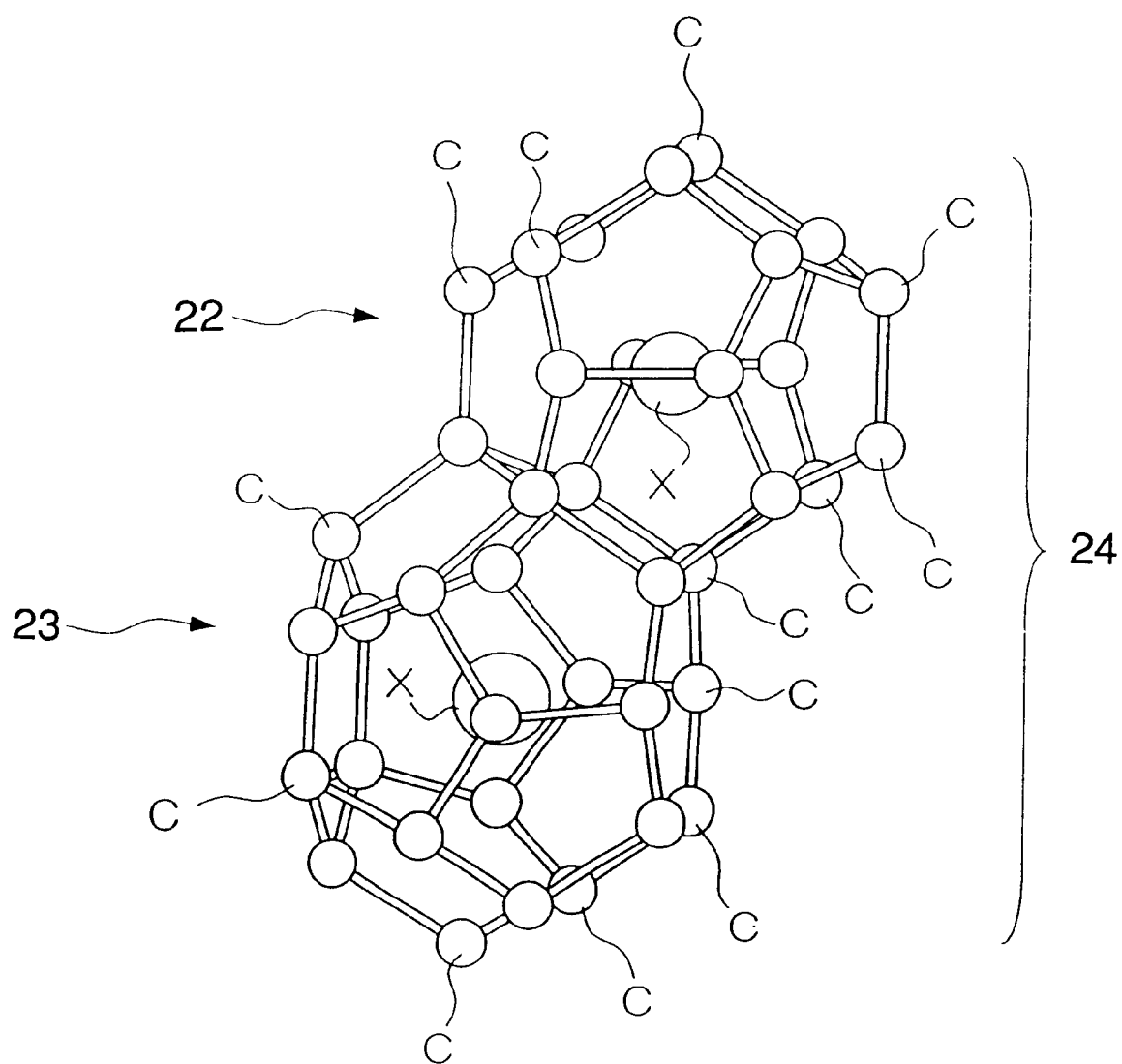
FIG. 6 is a schematic drawing showing the crystal structure of a partial structural unit of a carbon clathrate 46.

A carbon clathrate lattice 21 comprises a plurality of structural units 24 shown in FIG. 6, each of which comprises a combination of a $C_{20}$ cluster 22 made up of a dodecahedron of C atoms and a $C_{24}$ cluster 23 made up of a tetradecahedron of C atoms, which are combined to form the carbon clathrate lattice 21 shown in FIG. 5 in which a carbon atom is positioned at the apex of each lattice.

Figure 7:
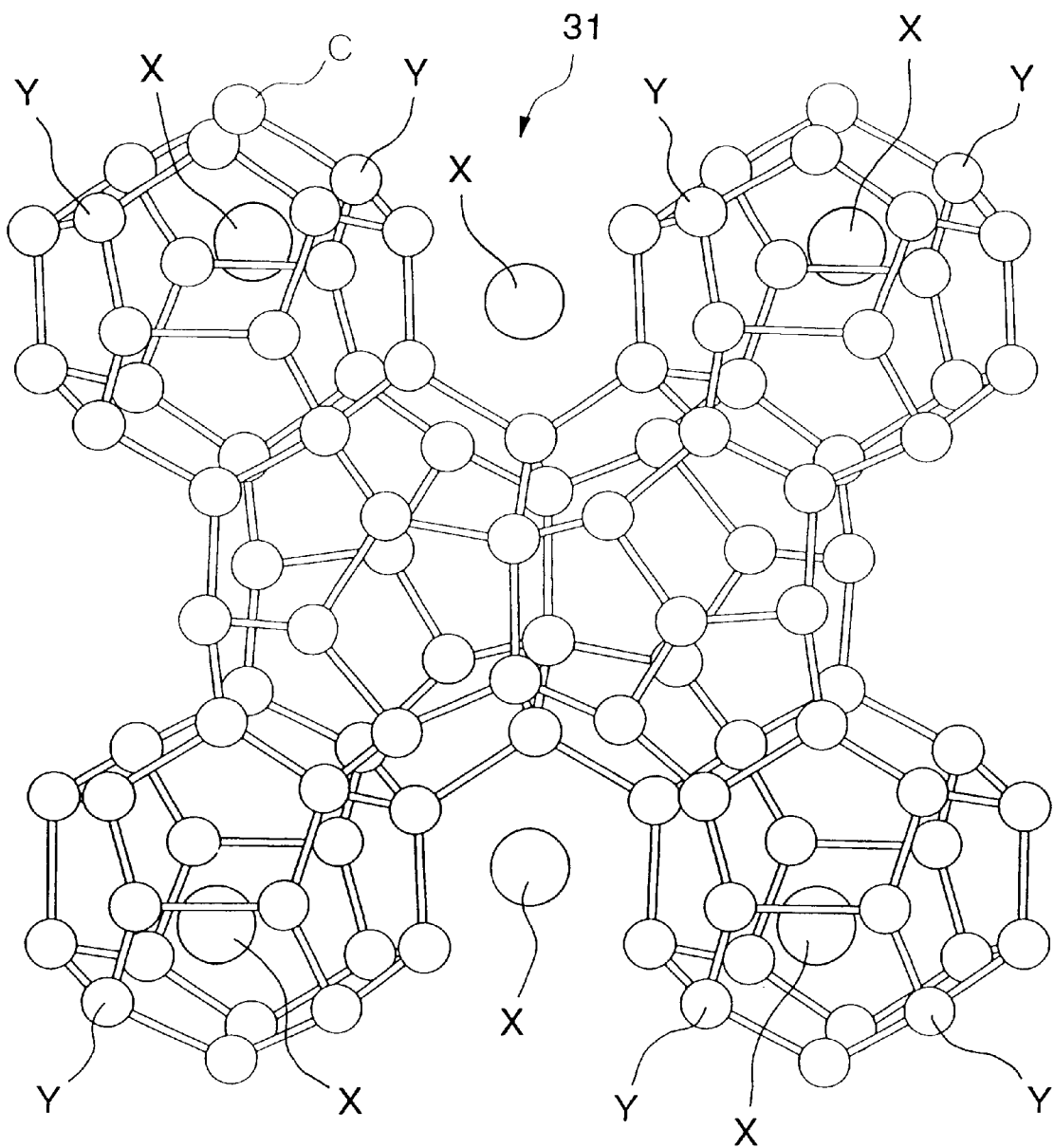
FIG. 7 is a schematic drawing showing the crystal lattice structure of a carbon clathrate 46 according to the present invention.

FIG. 7 shows the structure of a clathrate compound of the present invention which utilizes a carbon clathrate 46 ($C_{46}$). At least one type of doping atom X from group 1A, group 2A, group 3A, group 1B, group 2B, group 3B, group 4A, group 5A, group 6A or group 8 of the periodic table is encapsulated within at least a portion of the 2a sites of the $C_{20}$ clusters or the 6d sites of the $C_{24}$ clusters.

In addition, of the plurality of carbon atoms (C) which comprise the carbon clathrate lattice, at least a portion of the carbon atoms are substituted by at least one type of atom Y from group 1A, group 2A, group 3A, group 1B, group 2B, group 3B, group 5A, group 6A, group 7A, group 5B, group 6B, group 7B or group 8 of the periodic table.

(Fourth Embodiment) $C_{34}$ Compound

Figure 8:
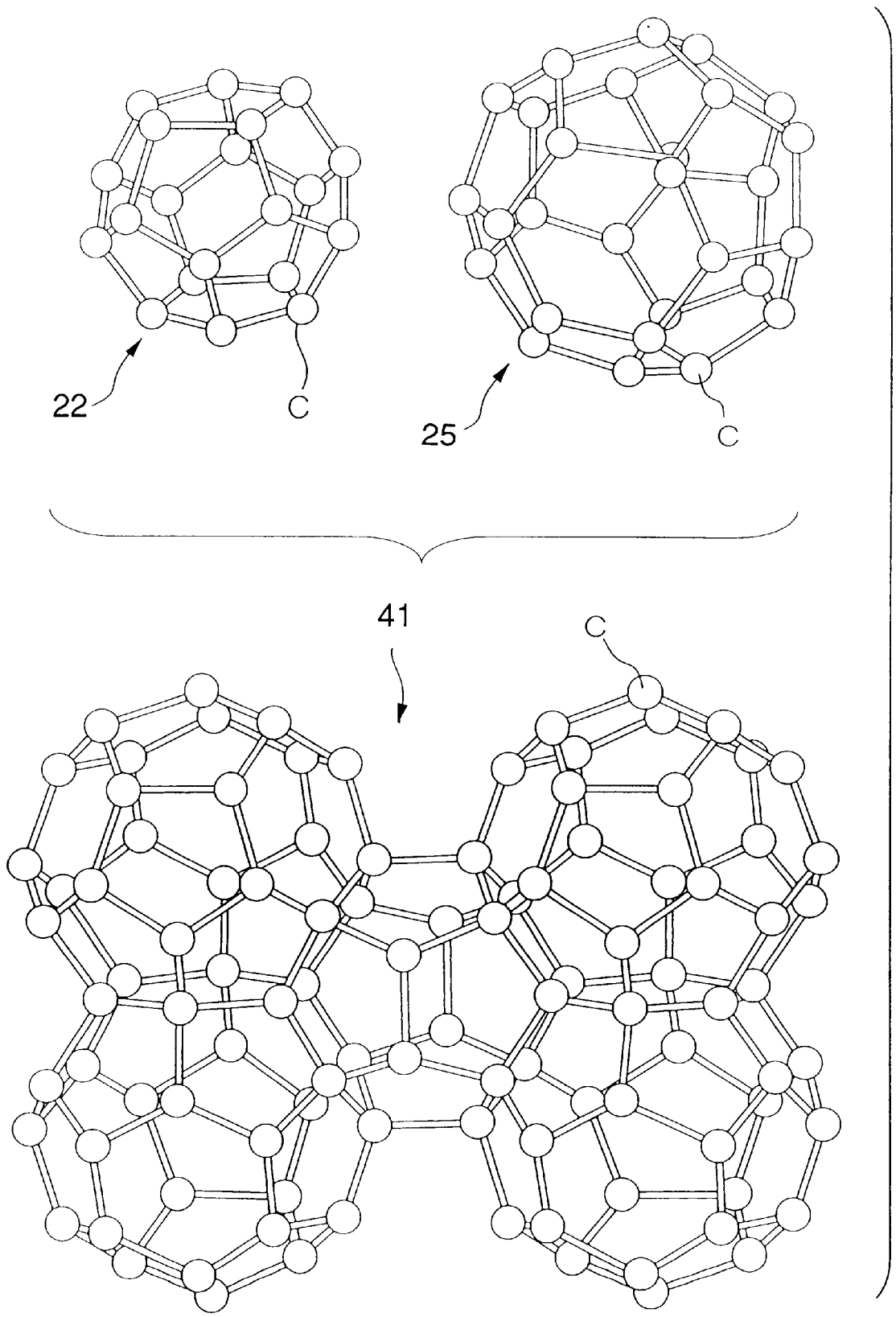
FIG. 8 is a diagram describing the formation process for a carbon clathrate 34.

A clathrate compound of the present invention may also be a carbon clathrate 34 ($C_{34}$) which is a mixed lattice of a $C_{20}$ cluster made up of a dodecahedron of C atoms, and a $C_{28}$ cluster made up of a hexadecahedron of C atoms. FIG. 8 shows a schematic representation of a formation process for a carbon clathrate 34 ($C_{34}$).

Figure 9:
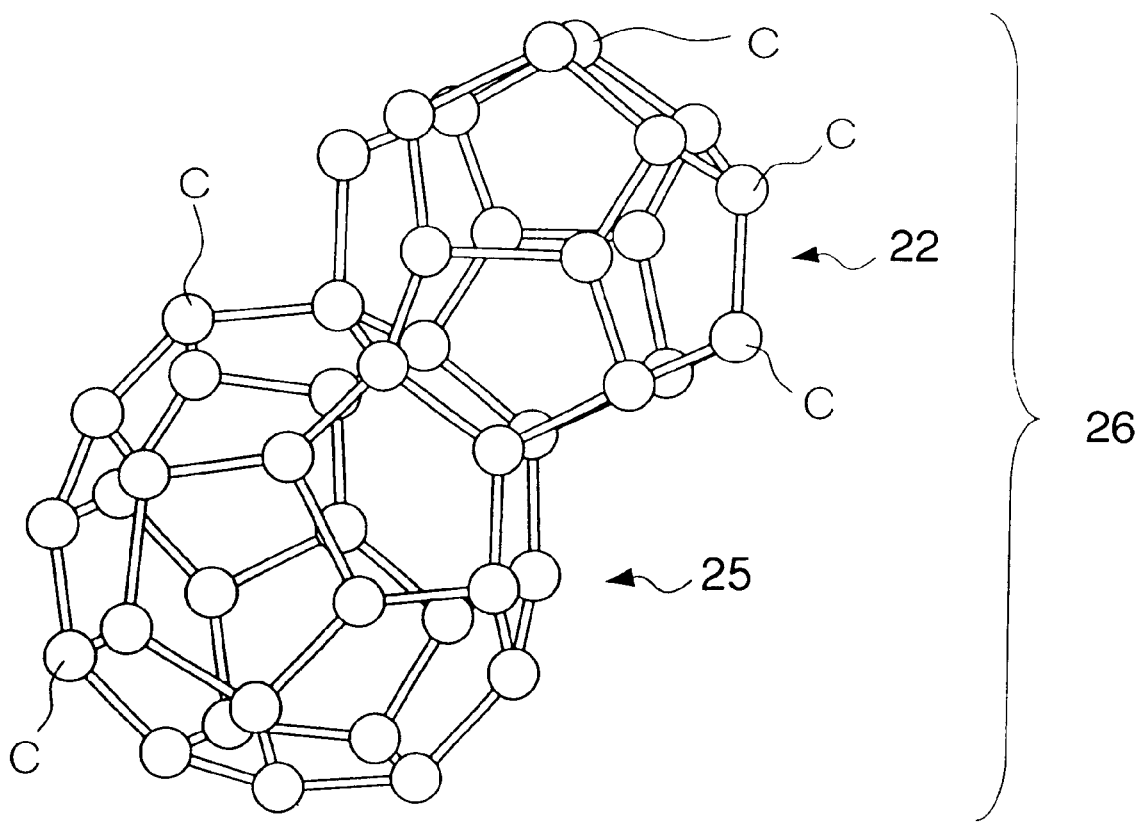
FIG. 9 is a schematic drawing showing the crystal structure of a partial structural unit of a carbon clathrate 34.

A carbon clathrate 34 comprises a plurality of structural units 26 shown in FIG. 9, each of which comprises a combination of a $C_{20}$ cluster 22 made up of a dodecahedron of C atoms and a $C_{28}$ cluster 25 made up of a hexadecahedron of C atoms, which are combined to form the carbon clathrate lattice 41 shown in FIG. 8 in which a carbon atom is positioned at the apex of each lattice.

Figure 10:
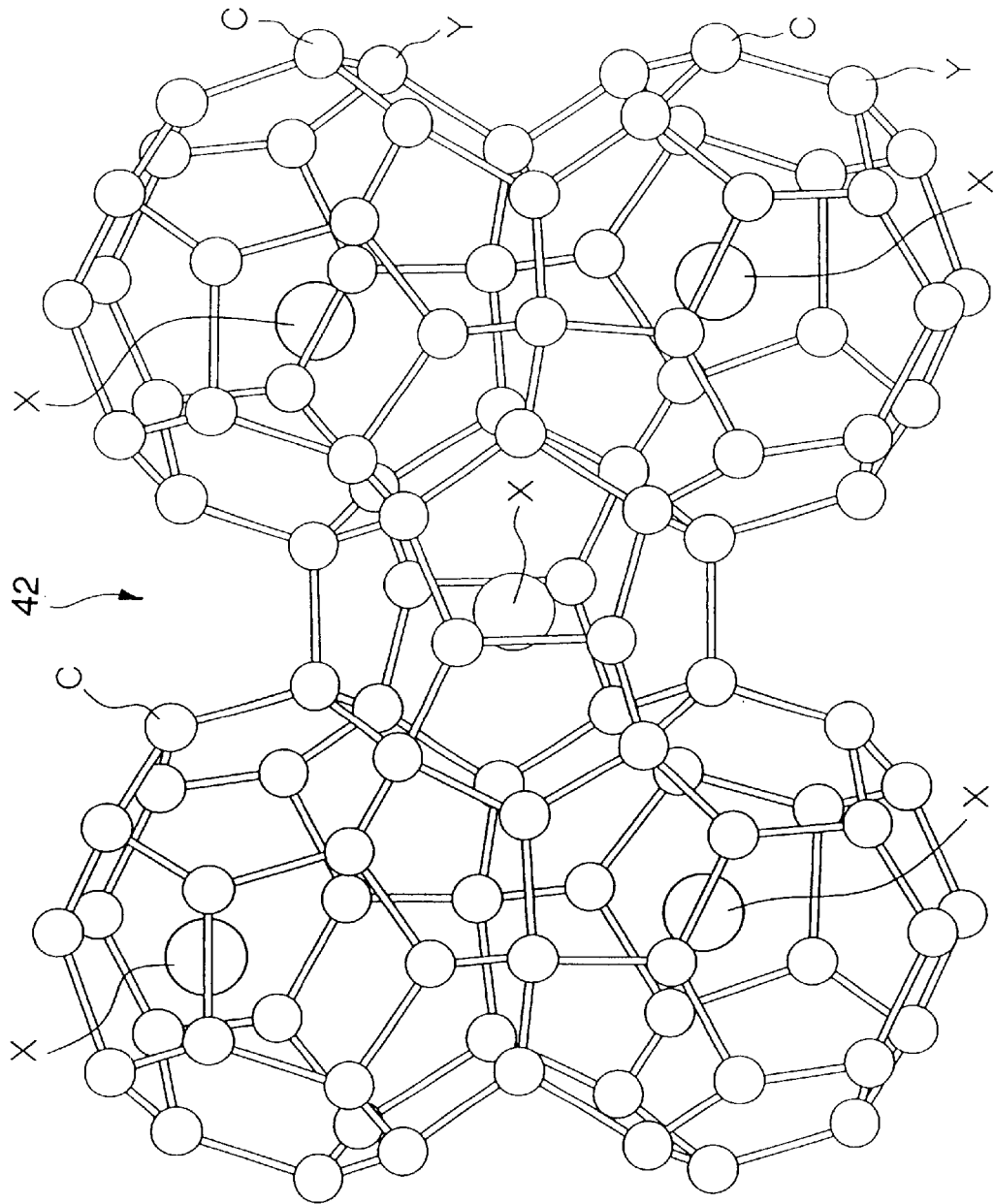
FIG. 10 is a schematic drawing showing the crystal lattice structure of a carbon clathrate 34 according to the present invention.

FIG. 10 shows the lattice structure of a clathrate compound of the present invention which utilizes a carbon clathrate 34 ($C_{34}$). In the carbon clathrate compound 42 shown, at least one type of doping atom X from group 1A, group 2A, group 3A, group 1B, group 2B, group 3B, group 4A, group 5A, group 6A or group 8 of the periodic table is encapsulated within at least a portion of the 2a sites of the $C_{20}$ clusters or the 6d sites of the $C_{28}$ clusters.

In addition, of the plurality of carbon atoms (C) which comprise the carbon clathrate lattice, at least a portion of the carbon atoms are substituted by at least one type of atom Y from group 1A, group 2A, group 3A, group 1B, group 2B, group 3B, group 5A, group 6A, group 7A, group 5B, group 6B, group 7B or group 8 of the periodic table.

(Fifth Embodiment) Thermoelectric Materials

Next is a description of what the inventors consider guidelines for material development of the aforementioned clathrate compounds to produce suitable thermoelectric materials. No clear development guidelines currently exist for material design of this type of thermoelectric material, and so the following development guidelines are presented as the individual thoughts of the inventors. The description below describes a sample clathrate compound which has undergone doping with Ba atoms, and substitution with Al atoms, as shown in FIG. 1.

(1) Reducing the Thermal Conductivity

It is considered that diffusing the lattice vibration of a clathrate compound enables a reduction in the thermal conductivity of thermoelectric materials of the clathrate compound. Especially, a doping atom is selected which has a greater mass than the atoms comprising the clathrate framework, and these doping atoms are then introduced into the empty sites within the clathrate framework. As a result, the doping atoms suppress vibration of the atoms comprising the framework. This suppression results in phonon scattering, enabling a reduction in the thermal conductivity.

Next, an ab initio pseudopotential calculation based on the plane wave base of the solid solution energy ($E_{Ba}$) of Ba can be expressed by the following equation.

$$E_{Ba}=(1/X)\cdot(Ba_x@Si_{46}-Si_{46})-Ba_1^{(isolate-atom)} \quad (2)$$

In the above equation, x represents the number of barium atoms in solid solution, $Ba_x@Si_{46}$ represents the total energy of the electron system when x barium atoms are solubilized in silicon clathrate 46, $Si_{46}$ represents the total energy of the electron system of a silicon clathrate 46 unit, and $Ba_1^{(isolate-atom)}$ represents the total energy of the electron system of a single isolated barium atom.

Below, the barium solid solution energy is shown for examples in which two, six, and eight barium atoms are inserted into a silicon clathrate as shown in FIG. 1.

(1) $Ba_2@Si_{46}$(2a site, dodecahedron)
   Barium solid solution energy: −91.150/(eV/atm)
(2) $Ba_6@Si_{46}$(6d site, tetradecahedron)
   Barium solid solution energy: −92.805/(eV/atm)
(3) $Ba_8@Si_{46}$(2a site +6d site)
   Barium solid solution energy: −93.628/(eV/atm)

From these results it is apparent that solubilizing larger numbers of barium atoms in the silicon clathrate makes the lattice energetically more stable, and so it becomes easier to insert a Ba atom into all of the void sites of a silicon clathrate lattice according to the present invention, thereby enabling a reduction in the thermal conductivity by scattering any lattice vibration.

(2) Improving the Seebeck Coefficient

By insertion of doping atoms with between 1~3 valence electrons from any one of group 1A, group 2A, group 3A, group 1A, group 1B, group 2B or group 3B into the vacant sites within the group 4B silicon clathrate lattice 1, the 1~3 valence electrons of each of the doping atoms will migrate to the group 4B atoms comprising the clathrate. As a result, the entire clathrate lattice 1 can be made metal-like. If at least a portion of the Si atoms comprising the silicon clathrate lattice 1 are then substituted with atoms from any one of group 1A, group 2A, group 3A, group 1B, group 2B and group 3B, the metallic properties of the lattice can be altered to semiconductor-like properties, enabling the Seebeck coefficient to be increased.

(3) Improving the Electrical Conductivity

Because the group 4B atoms comprising the silicon clathrate lattice 1 are semiconductors, the electrical conductivity cannot be increased with only group 4B atoms. Therefore, by introducing atoms with metallic properties from any one of group 1A, group 2A, group 3A, group 1B, group 2B and group 3B into the vacant site within the silicon clathrate basic structural unit, the electrical conductivity can be increased.

As a result, a silicon clathrate compound according to the embodiments of the present invention displays a combination of low thermal conductivity, high Seebeck coefficient and high electrical conductivity characteristics not seen in conventional thermoelectric materials, and also possesses a figure of merit superior to conventional thermoelectric materials. Furthermore, silicon clathrate compounds according to the embodiments of the present invention will be a p-type thermoelectric material.

(Sixth Embodiment) Thermoelectric Modules

Figure 11:
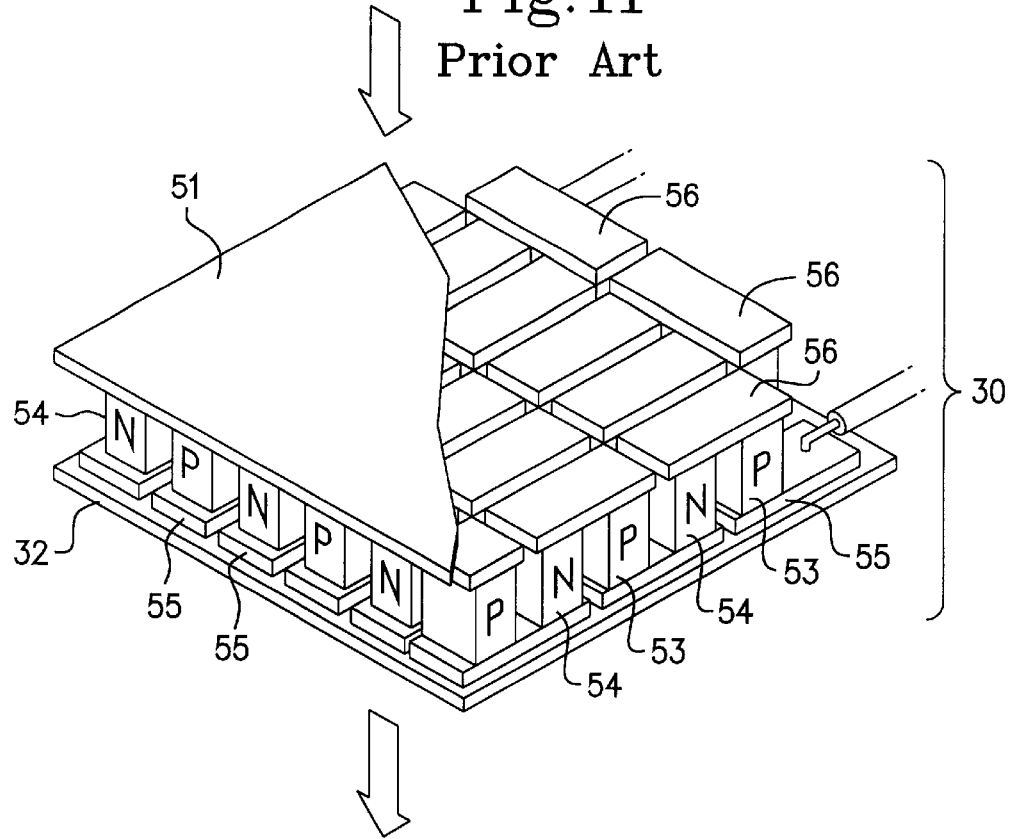
FIG. 11 is a perspective diagram showing an embodiment of a thermoelectric module constructed using thermoelectric elements according to the present invention.

FIG. 11 shows one embodiment of a thermoelectric module constructed using a thermoelectric material of a silicon clathrate compound according to the present invention. In a thermoelectric module 50 of this embodiment, a plurality of thermoelectric elements 53 made from columns of a p-type thermoelectric material, and a plurality of thermoelectric elements 54 made from columns of an n-type thermoelectric material are arranged alternately between opposing insulation substrates 51, 52 which are positioned top and bottom. The bottom edge sections of pairs of adjacent thermoelectric elements 53, 54 are connected by an electrode plate 55, and the top edge sections of different pairs of adjacent thermoelectric elements 53, 54 are connected by an electrode plate 56, while the tip sections of adjacent p-type thermoelectric elements 53 and n-type thermoelectric elements 54 are connected alternately by a plurality of electrode plates 55, 56 so that all of the thermoelectric elements are connected together in series. Furthermore, of the plurality of thermoelectric elements 53, 54 arranged between the upper and lower substrates, a connection wiring 57 is connected to one side of the tip sections of the thermoelectric elements 53, and another connection wiring 58 is connected to the other side of the tip sections of the other thermoelectric elements 54.

Of the thermoelectric elements 53, 54, the p-type elements are constructed from a thermoelectric material comprising the aforementioned clathrate compound, whereas the n-type thermoelectric material may be chosen appropriately from conventional materials which show a thermoelectric performance figure of merit.

Figure 12A:
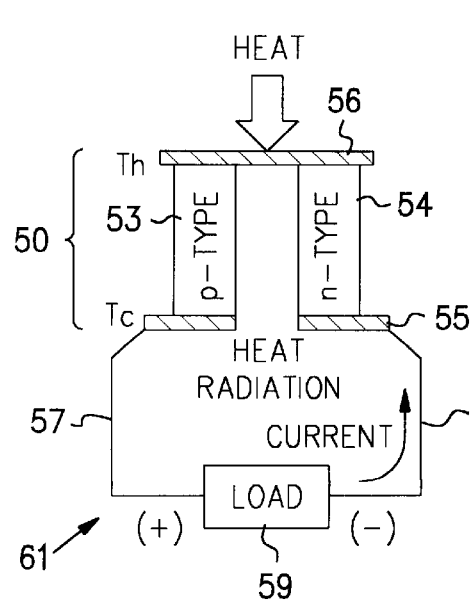
FIG. 12A represents a construction in which thermoelectric power generation takes place and FIG. 12B represents a construction in which thermoelectric cooling takes place.

According to the thermoelectric module 50 of the construction shown in FIG. 11, if the module is configured so that, as shown in FIG. 12A, the upper electrode plate 56 is heated and a load such as a resistance is connected between the two sets of connection wiring 57, 58 to complete an electrical circuit 61, then by continuous heating of the electrode plate 56 with another heat source, and heat radiation at the electrode plate 55, a potential difference can be formed between the two sets of connection wiring 57, 58 allowing a current to flow, which enables the module to be used for thermoelectric power generation.

Figure 12B:
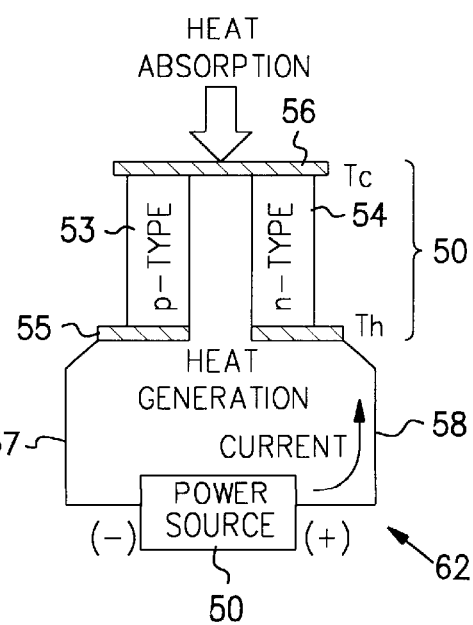

In addition, according to the thermoelectric module 50 of the construction shown in FIG. 11, if the module is configured so that, as shown in FIG. 12B, a power source 60 is connected between the connection wiring 57, 58, then by allowing a current to flow in the direction of the arrow, a heat absorption action can be realized at the upper electrode plate 56, while heat generation occurs at the lower electrode plate 55, which enables the module to be used as a thermoelectric cooler.

Figure 13:
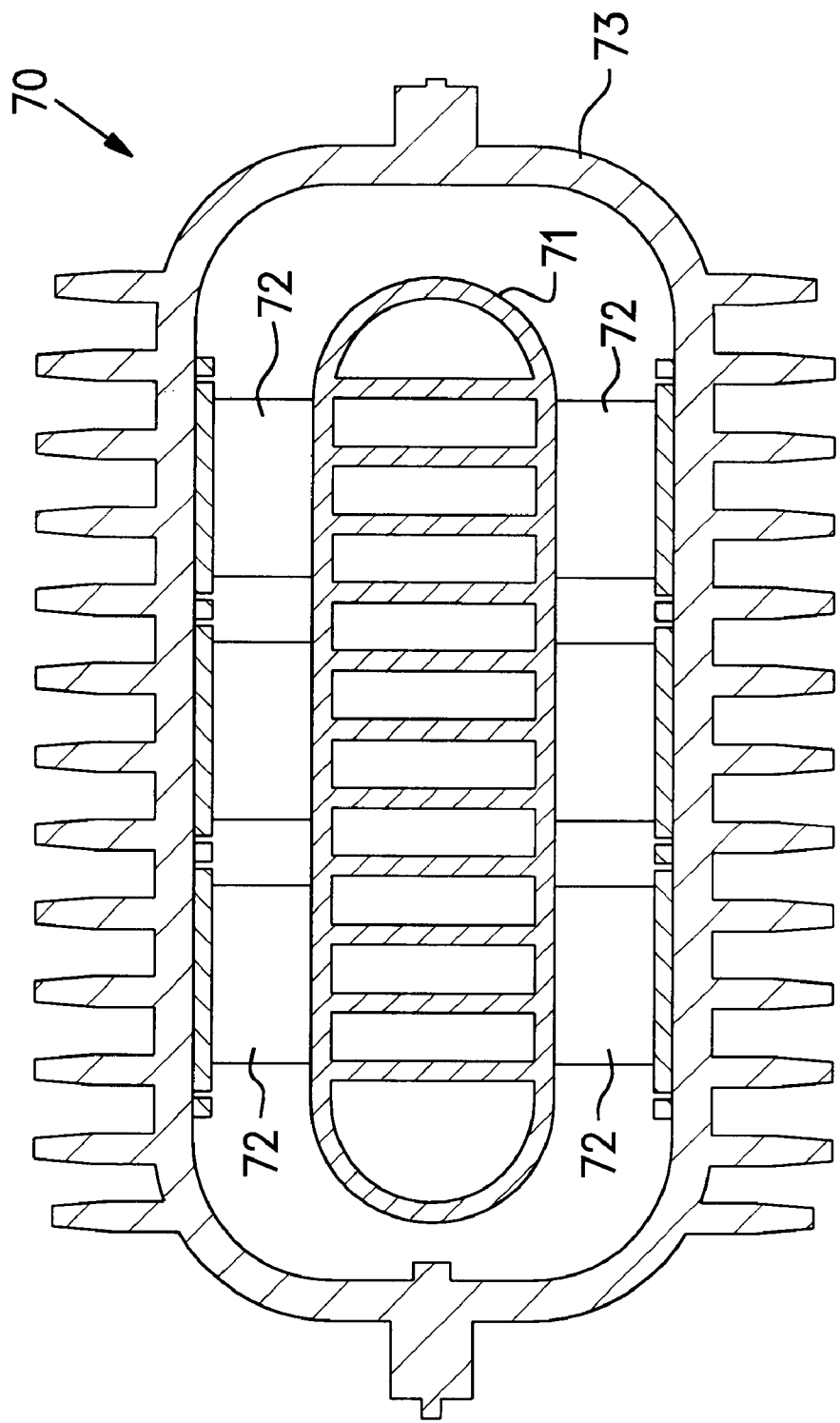
FIG. 13 is a cross-sectional view showing an example of the use of a thermoelectric module according to the present invention in a power generation stack.

FIG. 13 shows an example of a power generation stack using a thermoelectric material according to the present invention. In the example shown, a power generation stack 70 is constructed from six power generation modules 72 installed around the outer periphery of an inner shell 71 comprising an oblate tube with multiple apertures through which exhaust gas and the like can flow, and an oblate outer shell 73 which is provided on the outside of the power generation modules 72 to cover the modules. The heat of the exhaust gas flowing through the inner shell 71 is then used to conduct power generation.

According to a power generation stack of this embodiment, by constructing a power generation module 72 in the same manner as that described for the previous embodiment of a thermoelectric module 50, the thermoelectric module 50 can be used for power generation purposes.

As follows is a description of the figure of merit (ZT), which is widely used as a performance index for thermoelectric materials.

The performance of a thermoelectric material is represented by the following equation $$Z = \alpha^2 / \kappa \rho \quad (3)$$

where $\alpha$ represents thermoelectric power capacity, $\kappa$ represents thermal conductivity, and $\rho$ represents resistance.

Furthermore, the figure of merit for the thermoelectric module shown in FIG. 9 is represented by the following equation $$Z_{pn} = (\alpha_p - \alpha_n)^2 / (\kappa_p \rho_p + \kappa_n \rho_n) \quad (4)$$

where the subscripts p, n correspond with the values for p-type forms and n-type forms respectively.

The maximum power generation efficiency for a thermoelectric material is represented by the following equations $$\eta_{max} = (T_h/T_h - T_c) \cdot \{(M-1)/(M+T_h/T_c)\} \quad (5)$$

$$M = (1 + Z(T_h + T_c)/2)^{1/2} \quad (6)$$

where $T_h$ and $T_c$ represent the temperatures at the high temperature end and the low temperature end respectively.

In contrast, the maximum coefficient of performance for thermoelectric cooling is represented by the following equation $$\phi_{max} = (T_h/T_h - T_c) \cdot \{(M - T_h/T_c)/(M+1)\} \quad (7)$$

and the maximum coefficient of performance for thermoelectric heating is $\phi_{max} + 1$. Furthermore, if the heat absorption section is completely insulated with no heat influx, then the value of $T_c$ is reduced to a minimum, and if $\phi_{max}$ is set to zero, then the maximum cooling temperature difference is obtained from the following relationship.

$$\Delta T_{max} = (T_h - T_c)_{max} = (\frac{1}{2}) \cdot Z T_c^2 \quad (8)$$

Typically, thermoelectric cooling and heating is used for temperature differences close to room temperature $(T_h - T_c) \leq 100$ K, and so a large value of Z becomes a required condition, and currently, values of at least $3.4 \times 10^{-3} K^{-1}$ are required.

In contrast, for thermoelectric power generation, even if the value of Z is comparatively low, then by increasing the value of $T_h$ the efficiency can be increased, but this increase requires a heat resistant material which is chemically stable at high temperatures. Typically, the figure of merit Z for a material has an inherent temperature dependency, although the temperature which displays the maximum value of Z will vary depending on the material.

Currently, a material for which the maximum value ZT of the figure of merit Z exceeds 1 is GeTe—AgSbTe$_2$, and the majority of other materials display a ZT value less than 1.

Figure 14:
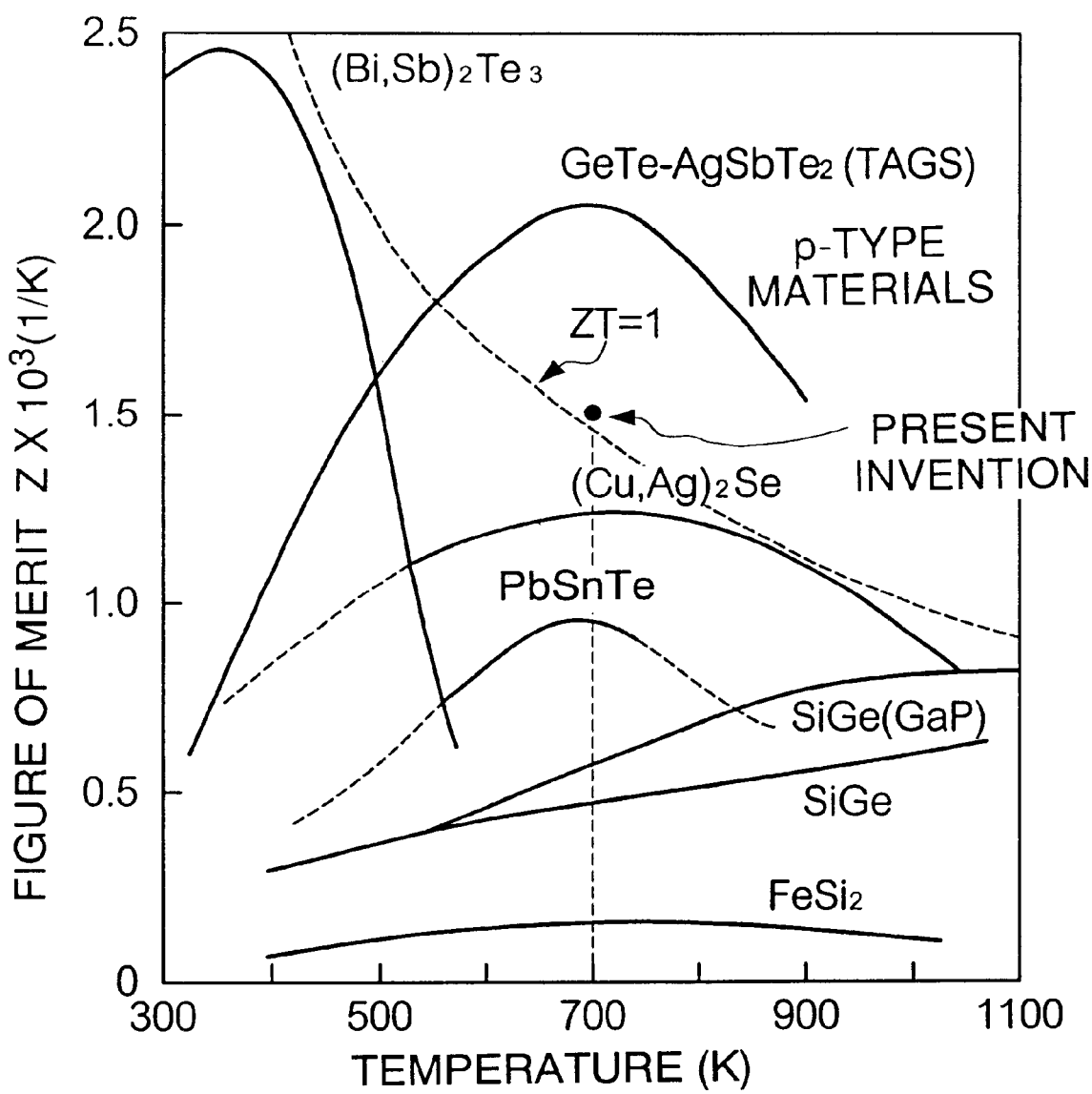
FIG. 14 is a graph showing the absolute temperature dependency of the figure of merit for conventional p-type thermoelectric materials, and for a thermoelectric material according to the present invention.
Figure 15:
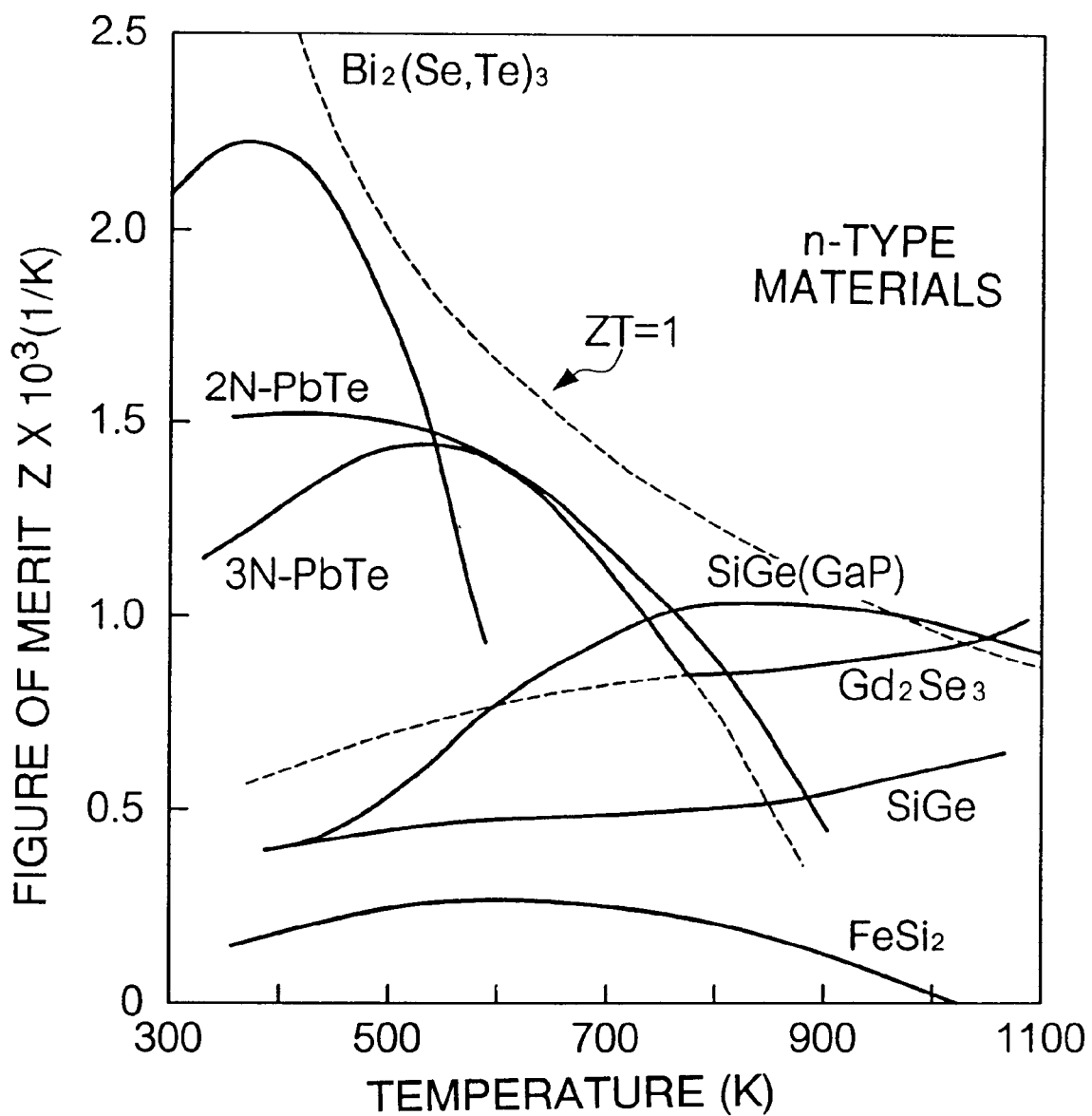
FIG. 15 is a graph showing the absolute temperature dependency of the figure of merit for conventional n-type thermoelectric materials.

FIG. 14 and FIG. 15 are graphs showing the absolute temperature dependency of the figure of merit for conventional p-type and n-type thermoelectric materials, and as is clearly evident from these graphs, the only p-type material for which the maximum value ZT of the figure of merit exceeds 1 is GeTe—AgSbTe$_2$ within the temperature range 600~900 K. No other materials exist. Furthermore, in the case of n-type materials, only SiGe(GaP) displays promise, and only within a specific narrow temperature range. At standard temperatures of approximately 700 K no n-type materials exist with a ZT value greater than 1.

Compared with this situation, thermoelectric materials according to the present invention are able to provide p-type thermoelectric materials with ZT values greater than 1, as is clearly evident from the working examples described below. Consequently, by constructing a thermoelectric module with a thermoelectric material of the present invention, thermoelectric modules can be provided which displays a high efficiency value, markedly superior to the values observed for conventional thermoelectric materials.

Next is a description of the Seebeck coefficient.

In the thermoelectric modules shown in FIG. 12B, if current flows from the power source 60 in the direction of the arrow, then a current I flows through the circuit 62, and Peltier heat generation occurs at the upper electrode plate 56. If the Seebeck coefficient of the n-type thermoelectric element 54 is $-\alpha_n$, the Seebeck coefficient of the p-type element is $\alpha_p$, and the Seebeck coefficient of the electrode plate is $\alpha_m$, then the Peltier heat absorption $Q_{cp}$ between the pn element and the upper electrode is represented by the following equation $$Q_{cp} = (-\alpha_n - \alpha_m)T_c I + (\alpha_m - \alpha_p)T_c I = -(\alpha_n + \alpha_p)T_c I$$

where $\alpha_m$ can therefore be ignored. $T_c$ here represents the temperature at the connection section. If $\alpha_e = \alpha_n + \alpha_p$ then the absolute value $Q_{cp}$ of the amount of heat absorption can be represented by $Q_{cp} = \alpha_e T_c I$.

In this type of calculations of thermoelectric module heating, the Seebeck coefficient acts as an indicator, and so the value of this coefficient is widely appreciated as having a large effect in the improvement of thermoelectric module performance.

(Seventh Embodiment) Semiconductor Material

Next is a description of guidelines for the application of the aforementioned clathrate compounds as suitable semiconductor materials.

Clathrate lattices of group 4B elements basically display semiconductor-like or insulator-like properties and have a high Seebeck coefficient, but the electrical conductivity thereof is low, and the thermal conductivity is high. By introducing into the clathrate lattice, atoms from groups 1A~3B, groups 4A~6A, or group 8 of the periodic table which have a smaller electronegativity than the atoms of the clathrate lattice, and moving electric charge to the atoms which make up the clathrate lattice, the bonds within the clathrate lattice are strengthened, vibration within the clathrate lattice is suppressed, and the thermal conductivity is lowered, while the clathrate lattice takes on a metallic property, thereby increasing the electrical conductivity. In addition, in order to control the degree to which the clathrate lattice adopts metallic properties as a result of the atoms inserted into the lattice, a portion of the clathrate lattice is substituted with an element or elements from groups 1A~3B, groups 5A~7B, or group 8 of the periodic table which have either more, or alternatively fewer, valence electrons than the atoms of the clathrate lattice, thereby shifting the metallic properties closer to semi-metallic properties, that is, semiconductor-like properties. This method enables the production of superior p-type or n-type semiconductors with wide forbidden bandwidths.

A clathrate compound semiconductor according to the present invention should preferably be either a silicon (Si) clathrate lattice or a carbon (C) clathrate lattice. The use of carbon clathrate lattices offers the advantage of enabling particularly wide forbidden bandwidths to be achieved. In those cases where the aforementioned clathrate lattice is of carbon, carbon clathrate 46 ($C_{46}$), which is a mixed lattice of a $C_{20}$ cluster comprising a dodecahedron of C atoms and a $C_{24}$ cluster comprising a tetradecahedron of C atoms, may be used.

Alternatively, the clathrate lattice may also use carbon clathrate 34 ($C_{34}$), which is a mixed lattice of a $C_{20}$ cluster comprising a dodecahedron of C atoms and a $C_{28}$ cluster comprising a hexadecahedron of C atoms.

In those cases where the aforementioned clathrate lattice is of silicon, silicon clathrate 46 ($Si_{46}$), which is a mixed lattice of a $Si_{20}$ cluster comprising a dodecahedron of Si atoms and a $Si_{24}$ cluster comprising a tetradecahedron of Si atoms, may be used.

Alternatively, the clathrate lattice may also use silicon clathrate 34 ($Si_{34}$), which is a mixed lattice of a $Si_{20}$ cluster comprising a dodecahedron of Si atoms and a $Si_{28}$ cluster comprising a hexadecahedron of Si atoms.

In a clathrate compound semiconductor of the present invention, suitable doping atoms which may be used for encapsulation within the clathrate lattice include atoms from group 1A, group 2A, group 3A, group 1B, group 2B, group 3B, group 4A, group 5A, group 6A or group 8 of the periodic table which have a smaller electronegativity than the atoms comprising the clathrate lattice. If the electronegativity of the doping atom exceeds the electronegativity of the atoms which make up the clathrate lattice, then electrical charge will accumulate in the atoms encapsulated within the atoms comprising the clathrate lattice, and will not transfer from the encapsulated atoms to the clathrate lattice, and consequently the bonding within the clathrate lattice will not be strengthened.

The electronegativity of an atom represents the ability of a bonded atom to attract electrons. The larger the difference in electronegativity between two bonded atoms, the more electrons will be attracted towards one of the atoms, and the greater the ionicity of the bond will become. Furthermore, the electronegativity of an atom is also a measure of the donor property and acceptor property of the electrons of that atom. The smaller the value of the electronegativity, the greater the donor property, whereas in contrast the greater the value of the electronegativity, the stronger the acceptor property.

The electronegativity of each atom, as represented by Pauling, is as shown in FIG. 16.

As is shown in FIG. 16, the electronegativity of atoms from group 4B of the periodic table which make up a clathrate lattice are 2.5 for carbon (C), and 1.8 for silicon (Si), germanium (Ge), tin (Sn) and lead (Pb). In FIG. 16 the size of the electronegativity is indicated by the size of the circle. Consequently, the atoms for encapsulation within a clathrate lattice should be atoms for which the circles are smaller than the circles for the group 4B atoms. Those atoms which display a smaller electronegativity than the group 4B atoms are generally atoms from group 1A, group 2A, group 3A, group 1B, group 2B, group 3B, group 4A, group 5A, group 6A of the periodic table, or transition metal elements selected from group 8.

As shown in FIG. 16, the electronegativity of carbon (C) is large, at 2.5, and almost all the atoms from groups 1A~3B, groups 4A~6A or group 8 have an electronegativity smaller than 2.5, and are therefore usable as doping atoms.

In comparison, the electronegativities of Si, Ge and Sn are all 1.8, and there are atoms within groups 1B~3B, group 7A and group 8 with electronegativities of 1.9 or greater, which are unable to be used as doping atoms.

For example, in those cases where the clathrate lattice is made up of carbon atoms (electronegativity=2.5), then nitrogen (N; electronegativity=3.0), oxygen (O; electronegativity=3.5), fluorine (F; electronegativity=4.0) and chlorine (Cl; electronegativity=3.0) which all have electronegativities greater than 2.5 are unable to be used as doping atoms.

The formation of a clathrate is determined by the electronegativities of the atoms. For example, the relationship between clathrate lattice atoms of a cluster made from n atoms, doping atoms, and substitution atoms will determine whether or not a clathrate is formed depending on the following conditions.

(a) Only clathrate lattice atoms
In the case where:
the electronegativity of the doping atoms is: $P^d$
and the electronegativity of the clathrate lattice atoms is: $P^c$
then if $P^d < P^c$, a clathrate will form
whereas if $P^d \geq P^c$, a clathrate will not form.

(b) A cluster of clathrate lattice atoms comprises n atoms, and substitution atoms are also incorporated
In the case where:
the electronegativity of the doping atoms is: $P^d$
and the electronegativity of the clathrate lattice atoms is: $Pi^c$
and the electronegativity of the clathrate lattice substitution atoms is: $Pj^s$
then if $$P^d < \frac{1}{n} \sum_{i,j}^{n=i+j} (Pi^c + Pj^s) \qquad (9)$$

$$P^d \geq \frac{1}{n} \sum_{i,j}^{n=i+j} (P_i^e + P_j^e) \quad (10)$$

a clathrate will not form.

In a clathrate compound semiconductor of the present invention, and in the case of a p-type semiconductor, atoms which have fewer valence electrons than the atoms comprising the clathrate lattice are used for the substitution atoms which are substituted for the atoms which make up the clathrate lattice. Furthermore in the case of an n-type semiconductor, atoms which have more valence electrons than the atoms comprising the clathrate lattice are used.

The number of valence electrons refers to the number of electrons in the outermost shell of the atomic structure electron arrangement, and determines the chemical properties of the atom.

In a clathrate compound semiconductor, the number of valence electrons of the atoms comprising the clathrate lattice is four, and so in the case of a p-type semiconductor, atoms with fewer than four valence electrons are used for the substitution atoms, which corresponds with atoms from group 1A, group 2A, group 3A, group 1B, group 2B and group 3B of the periodic table. Furthermore in the case of an n-type semiconductor, atoms with more than four valence electrons are used for the substitution atoms, which corresponds with atoms from group 5A, group 6A, group 7A, group 5B, group 6B, group 7B and group 8 of the periodic table.

For example, if an atom from any of group 1A, group 2A, group 3A, group 1B, group 2B or group 3B with between 1~3 valence electrons is inserted into the vacant sites of a clathrate lattice made of group 4B atoms, then the 1~3 valence electrons will migrate to the group 4B atoms comprising the clathrate lattice. As a result, the entire clathrate lattice will become more metal-like. If at least a portion of the atoms comprising the clathrate lattice are then substituted with atoms from any one of group 1A, group 2A, group 3A, group 1B, group 2B and group 3B, the metallic properties of the lattice can be altered to semiconductor-like properties, enabling the Seebeck coefficient to be increased.

Furthermore, because the group 4B atoms comprising the clathrate lattice are basically semiconductors, the electrical conductivity cannot be increased with only group 4B atoms. Therefore, by introducing atoms with metallic properties from any one of group 1A, group 2A, group 3A, group 1B, group 2B and group 3B into the vacant site within the clathrate basic structural unit, the electrical conductivity can be increased.

As a result, a clathrate compound according to the present invention has a wide forbidden bandwidth, displays a combination of low thermal conductivity, high Seebeck coefficient and high electrical conductivity characteristics not seen in conventional thermoelectric materials, and also shows the inherent clathrate compound characteristic of stable operation under conditions of high temperature or high pressure, and is therefore superior to conventional semiconductors.

The forbidden bandwidth of a clathrate compound of a semiconductor according to the present invention is, for example, 5.00 eV in the case of carbon clathrate 34, 5.16 eV in the case of carbon clathrate 46, 1.92 eV in the case of silicon clathrate 34, and 1.5 eV in the case of silicon clathrate 46. By using these wide forbidden bandwidth clathrate compound semiconductors, purple laser light emission elements of wavelength 400 nm are able to be realized.

Typically, the reason that semiconductor devices stop operating under high temperatures is that the leakage current increases with increases in the device temperature. When the leakage current increases, the joint interface between elements deteriorates. For example, in the case of a p-n joint, an increase in the leakage current within the joint leads to a deterioration in the withstand voltage. The leakage current density is determined by the following equation (11).

$$J_R \approx J_{G0}\left[\frac{T}{T_0}\right]^{\frac{3}{2}} \exp\left[-\frac{E_G}{2k_BT} + \frac{E_G}{2k_BT_0}\right] \quad (11)$$

In the equation (11), $J_{G0} \approx 2qni(T_0)V_B/E_G\tau e$, $E_G$ is the forbidden bandwidth, q is the electron charge, ni is the intrinsic carrier density, $k_B$ is Boltzman's constant, $\tau e$ is the electron relaxation time, and T is the absolute temperature.

Figure 17:
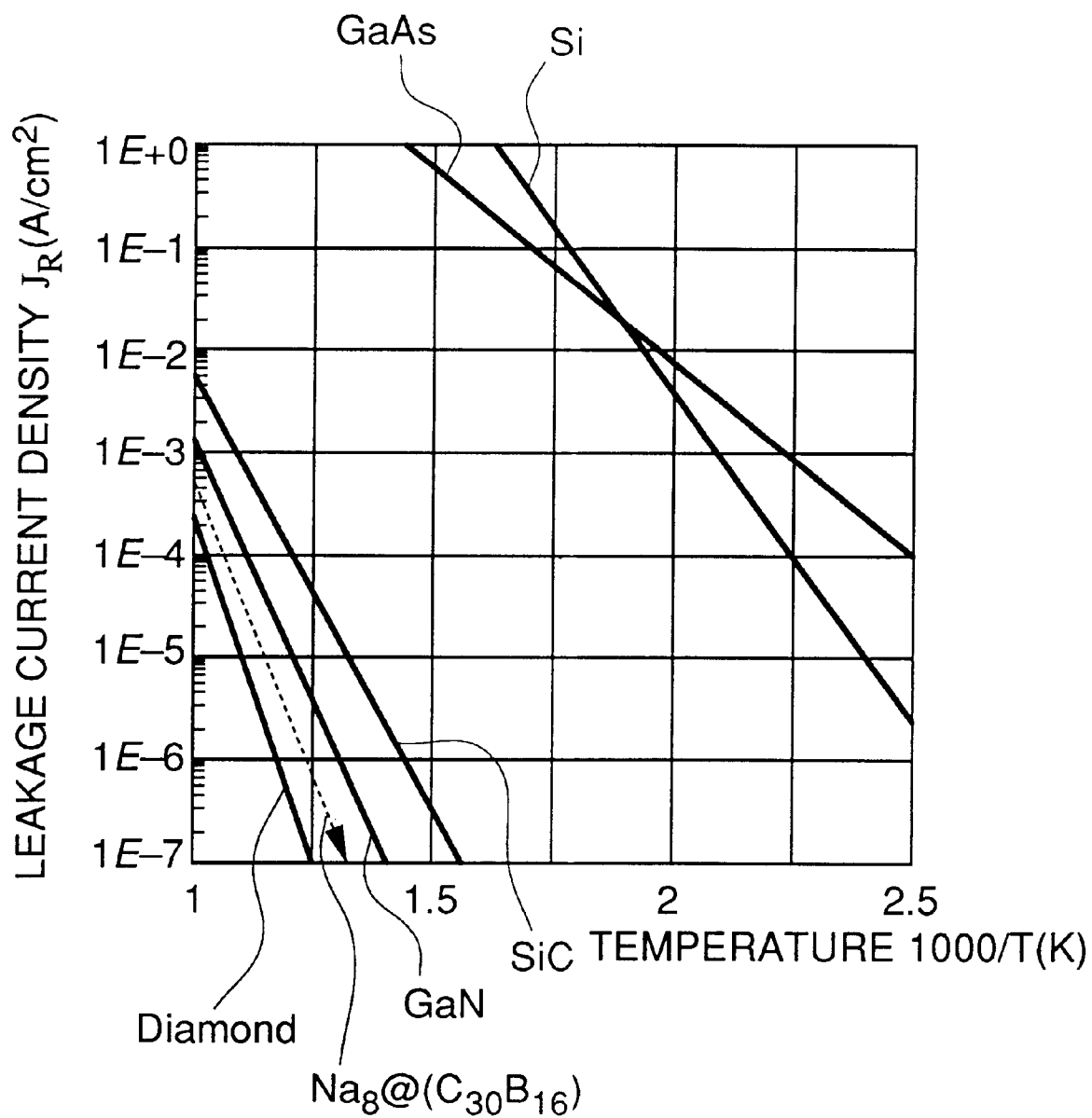
FIG. 17 is a graph showing the relationship between temperature and leakage current density.

If based on the equation (11), an estimation is made of the reverse direction leakage current density of a p-n joint for various semiconductor materials, then the relationships are as shown in FIG. 17. The leakage current increases with increasing temperature. It is clear, for example, that a $Na_8@(C_{30},B_{16})$ clathrate compound semiconductor of the present invention, or wide forbidden bandwidth semiconductors such as SiC and GaN, or diamond, display far smaller leakage current densities at high temperature than widely used semiconductors such as Si and GaAs. In this manner, a clathrate compound semiconductor according to the present invention displays little leakage current even at high temperatures due to the wide forbidden bandwidth, and is therefore able to achieve a stable operation.

The light emission transition process in which the light emission wavelength of a semiconductor is determined by the forbidden bandwidth inherent to the semiconductor material as described above is of the direct transition type. In a direct transition type process, an electron excited in the conduction band transitions to the valence electron band (an interband transition) without the emission or absorption of a phonon (lattice vibration), and so an extremely high emission efficiency can be achieved.

In contrast, in the case of an indirect transition where an electron transitions to the valence electron band with an accompanying emission/absorption of a phonon (lattice vibration), then the mode of light emission comprises a process in which an excited electron is bound by a dopant atom encapsulated within the crystal, and then emits light on subsequent transition to the valence band. As a result, emission wavelengths different from the wavelength based on the inherent forbidden bandwidth of the semiconductor material can be obtained.

(Eighth Embodiment) Hard Material

As follows is a description of guidelines for the application of the aforementioned clathrate compounds as suitable hard materials.

Carbon clathrate compounds which comprise carbon (C) as the clathrate lattice atoms, display a hardness second only to diamond. The bulk modulus of a $C_{34}$ clathrate (a structure comprising $C_{20}$ clusters and $C_{28}$ clusters in a three dimensional network) is only approximately 14% lower than that of diamond. Because the clathrate lattice itself possesses this degree of hardness, clathrate compounds are able to be used as hard materials regardless of the type of lattice atoms, doping atoms, or substitution atoms. A clathrate compound hard material according to the present invention is obtained as a product of pressure sintering techniques, and so has great value for components which require low friction and good abrasion resistance such as mechanical components and sliding components for which strength is necessary.

(Ninth Embodiment) Manufacturing Method 1

As follows is a description of a sample method of manufacturing a silicon clathrate compound.

In the case where the basic structural unit of silicon clathrate 46 is used, Si, a powder of the doping element, and a powder of the element for substitution of the clathrate basic structural unit are weighed and then mixed in the target constituent ratio, and this mixed powder is melted by arc melting and then formed into an ingot of the target composition. The powdered raw material used may be either powders of each of the pure elements or powdered compounds, but it is preferable that pure materials which contain no other elemental impurities are used.

Next, the ingot is ground, and the ground up powder is analysed by X-ray analysis to determined whether or not the target constituent ratio has been obtained. Powders which are of the target composition are then used. That is, if the composition of the powder is of the target constituent ratio then the powder is used in the next step, whereas if the composition is not of the target constituent ratio then the process is restarted at the powder mixing step, followed by ingot formation and subsequent analysis of the reformed ingot. Furthermore, it is preferable that the ground up powder is made up of granules of a regular, very small diameter.

Once a ground up powder of the target constituent ration has been obtained, the powder is submitted to heat treatment (calcination treatment), either in an Ar gas atmosphere or under vacuum, and the unused constituents converted to gaseous form and removed. Following the calcination treatment, the powder is ground up even further and the granular diameter made more uniform, and the powder is again analyzed by X-ray and another analysis made as to whether or not the constituent ratio is correct. Powders which display the target constituent ratio are then selected, the granular diameters aligned, and the powders then submitted to heated pressure sintering using a discharge plasma device to produce a sintered silicon clathrate compound of the desired shape.

Discharge plasma sintering is a type of pressure sintering which comprises pressurizing a powdered mixture between a pair of punches at a pressure of between several MPA and several dozen MPA, while concurrently applying an electric current and sintering the powdered mixture while heating to a temperature of approximately 1000° C. for a period of between several minutes and several hours.

In those cases where the aforementioned heat treatment is to be carried out, then it is preferable that in the manufacture of silicon clathrate 46 the heat treatment is conducted under an atmosphere of Ar, whereas in the manufacture of silicon clathrate 34, it is preferable that the heat treatment is conducted under vacuum conditions. Furthermore, in those cases where X-ray analysis reveals a constituent ratio different from the target composition, then the process is repeated from the arc melting and ingot formation step, with the same subsequent steps then being repeated.

However, in the manufacturing process described above, the arc melting may be replaced by carrying out a mechanical alloying treatment to produce a powdered mixture with the target constituent ratio. In a mechanical alloying treatment, the powders for mixing are placed inside a hollow atreiter which contains a plurality of metallic spheres made of stainless steel or the like, and the atreiter is then rotated at high speed, so that the powders are ground between the metallic spheres and mixed to produce a powdered mixture of uniform composition. Following formation of a powdered mixture through this type of mechanical alloying, the powdered mixture is submitted to a preliminary heat treatment, and then to sintering to produce a silicon clathrate compound thermoelectric element according to the present invention.

Furthermore, according to the above manufacturing method, in the case where Ba is selected as the doping atom and Al as the substitution atom, first Ba acts as a nucleus and attracts Si atoms and a plurality of clusters form, and then the clusters themselves bond together to construct the clathrate lattice. Consequently, by a very simple process of mixing the necessary elements, carrying out preliminary heating, and then sintering, a clathrate compound can be produced. As a result, a clathrate compound of the present invention is easier to manufacture than conventional thermoelectric materials, and moreover enables the production of a high efficiency product which displays a high figure of merit at temperatures above 700 K.

(Tenth Embodiment) Manufacturing Method 2 Melting Method

Another method of manufacturing a clathrate compound according to the present invention is a method wherein a compound of a group 4B element from the periodic table which incorporates at least one element to become the doping atoms and the substitution atoms is melted in an inert atmosphere, and following solidification, is cooled gradually, maintained at a temperature of at least 500° C. for a period of at least 10 hours, and is then cooled further, before being washed to remove any excess doping atoms and substitution atoms, and subsequently pressure sintered to form the clathrate compound.

In terms of raw materials, a mixture of at least one simple element of atoms from any of the aforementioned group 1A, group 2A, group 3A, group 1B, group 2B, group 3B, group 4A, group 5A, group 6A, and group 8 of the periodic table, and a simple element from group 4B of the periodic table may be used, but in order to ensure the reaction proceeds efficiently, in the present invention a group 4B compound, preferably a carbide, a silicide or a germanium compound, which incorporates at least one type of atom from group 1 A, group 2A, group 3A, group 1B, group 2B, group 3B, group 4A, group 5A, group 6A, and group 8 of the periodic table is used. In such cases, it is necessary to select materials that will allow any excess raw materials following reaction to be removed by washing in either water or acid. Although the most preferred arrangement is that the atoms from group 1A, group 2A, group 3A, group 1B, group 2B, group 3B, group 4A, group 5A, group 6A, or group 8 of the periodic table are incorporated within a group 4B compound, it is also possible to add a simple metal of at least one of the elements from group 1A, group 2A, group 3A, group 1B, group 2B, group 3B, group 4A, group 5A, group 6A, or group 8 of the periodic table to a group 4B compound, and then carry out any necessary adjustments of the composition.

Examples of suitable group 4B compounds include calcium carbide ($CaC_2$), barium silicide ($BaSi_2$) and sodium silicide (NaSi). $CaSi_2$ is not suitable as it is insoluble in water.

The raw material mixture which has been blended at the desired constituent ratio, is first melted to produce a uniform melt. There are no particular restrictions on the melting method employed, and for example, arc melting and high frequency melting can both be used effectively. The uniformly melted raw material mixture is then solidified and cooled gradually to approximately 1000° C. In order to prevent the solidification producing an amorphous material, rapid cooling should be avoided.

Next, the solidified material is maintained at a temperature of at least 500° C. and no more than 1500° C. for a period of at least 50 hours. The maintained temperature may be any temperature above the melting point of the doping atoms and substitution atoms, and in the case where the doping atoms are an alkali metal, then a temperature above 500° C. is sufficient, whereas in the case of a transition metal, the temperature will need to be raised to close to 1500° C. However in general, the use of high temperatures is not advantageous, and preferably temperatures between 1000° C. and 1200° C. are the most practical.

The time period for which the temperature is maintained will vary according to the temperature, but in order to promote solid state diffusion of the doping atoms and the substitution atoms, at least 50 hours is necessary. Time periods of at least 100 hours are even more desirable. For example, in those cases where a carbon clathrate lattice $C_{64}$ is used, then at least 100 hours is necessary. During this process, carbon atoms flocculate around elements which will readily release charge, forming clusters, and during the cooling these clusters align themselves in a three dimensional manner easing the formation of a clathrate crystalline structure, and so compared with conventional techniques, this manufacturing method offers the advantages of a rapid rate of formation of the clathrate compound, and an increase in the yield.

Next, following maintenance at a predetermined temperature for a predetermined time period, the material is cooled to room temperature.

Then, the solidified product is ground up, and any excess doping atoms or substitution atoms from group 1A, group 2A, group 3A, group 1B, group 2B, group 3B, group 4A, group 5A, group 6A, or group 8 of the periodic table incorporated within the solid product are removed by washing. The washing method comprises washing in water to remove any group 1A metals, and acid washing in a dilute acid solution such as 0.1 N hydrochloric acid solution.

Following washing, the powder is subject to pressure sintering (hot press) to produce the clathrate compound. The conditions for the pressure sintering process include a temperature of at least 800° C., a pressure of between several dozen MPa and several tens of thousands of MPa, and a pressure time period of between several minutes and several dozen hours, with values within these ranges between selected as appropriate.

There are no particular restrictions on the pressure sintering method, and for example a diamond anvil high pressure apparatus may be used, or alternatively discharge plasma sintering methods may be employed.

In this manner, a bulk clathrate compound which incorporates encapsulated doping atoms and substitution atoms can be synthesized simply and efficiently.

(Eleventh Embodiment) Manufacturing Method 3 Method Involving Spreading and Leaving As follows is a description of a third method of manufacturing a clathrate compound of the present invention. The raw materials used are the same as those used in the first and second manufacturing methods, and a compound from group 4B of the periodic table is used, which incorporates at least one of the elements to become the doping atoms and the substitution atoms as described above.

The raw material mixture which has been blended at the desired constituent ratio is first ground finely to a granular diameter of several dozen $\mu$m, and of no more than 100 $\mu$m. There are no particular restrictions on the grinding method, but in order to prevent oxidation, the grinding process should be conducted in an inert atmosphere.

Next, the fine powder is spread into a thin film inside a heat resistant vessel and then left to stand, and the vessel is then heated in an inert atmosphere inside a heating furnace at a temperature of between 500° C. and 1500° C., and maintained at that temperature for at least 50 hours.

Subsequently, in the same manner as that described for the second manufacturing method, any excess doping atoms or substitution atoms, being metals from group 1A, group 2A, group 3A, group 1B, group 2B, group 3B, group 4A, group 5A, group 6A, or group 8 of the periodic table, are removed by washing, and the clathrate compound then formed by pressure sintering. The pressure sintering method used is the same as that described above.

(Twelfth Embodiment) Manufacturing Method 4 A Method Using a Graphite Intercalation Compound As follows is a description of a fourth method of manufacturing a clathrate compound of the present invention. The raw material used differs from those described above in that an intercalant graphite intercalation compound is used. With the exception of this alteration in the raw materials, the method is identical with the third manufacturing method described above.

First is a description of the intercalant graphite intercalation compound.

Graphite is a typical intercalation compound in which hexagonal meshed graphite layers (distance between C atoms of 0.142 nm) comprising strong conjugated bonds are layered together (distance between layers of 0.335 nm) by van der Waals forces. The carbon atoms are neutral even in terms of electronegativity, and so graphite intercalation compounds (GID) can be formed by incorporation of either electronegative or electropositive atoms between the graphite layers. Intercalant graphite intercalation compounds are based on a graphite layered material host with a chemical species (intercalant) incorporated between the layers as a guest.

In those cases where a chemical species with a smaller electronegativity than the carbon atoms is incorporated, a donor type intercalant graphite intercalation compound is formed. Examples of known donor intercalant graphite intercalation compound include materials in which metals from group 1A, group 2A, group 3A, group 1B, group 4A, group 5A, group 6A, group 7A or group 8 of the periodic table are incorporated within the graphite layers. Specific examples include $LiC_6$, $NaC_{64}$, $KC_8$, $RbC_8$, $CsC_8$, $CaC_6$, $SrC_6$, $BaC_6$, $SmC_6$, $EuC_6$, and $YbC_6$, and other examples in which transition metals such as metallic iron have been inserted between the graphite layers have also been reported.

A structural feature of these intercalant graphite intercalation compounds is the formation of a stage configuration wherein the inserted chemical species sandwiches a number n of graphite layers in a regular repeating pattern. Furthermore, a feature of the chemical properties of donor type intercalant graphite intercalation compounds is that they demonstrate superconductivity and a hydrogen absorption affinity.

Examples of methods of manufacturing intercalant graphite intercalation compounds include a gaseous phase reaction method wherein graphite and a chemical species are isolated within a vacuum system, and the temperature of the two materials then controlled independently with a reaction temperature and a vapor pressure being selected to yield the target material, a melt method wherein graphite is impregnated into a molten alkali metal, as well as other electrolytic methods and reduction reaction methods.

Returning then to the method of manufacturing a clathrate compound according to the present invention, fine particles of no more than 100 $\mu$m of an intercalant graphite intercalation compound incorporating at least one type of element from group 1A, group 2A, group 3A, group 1B, group 2B, group 3B, group 4A, group SA, group 6A, or group 8 of the periodic table to become each of the doping atoms and the substitution atoms are spread in a thin film inside a heat resistant metal vessel and then left to stand, and are then heated in an inert atmosphere inside a heating furnace at a temperature of between 500° C. and 1 500° C. for a period of at least 50 hours.

In those cases where the intercalant graphite intercalation compound is obtained in fine granular form it may be used as is, but if the granules are coarse, then the material should be ground finely under an inert atmosphere to a granular diameter of several dozen μm, and of no more than 100 μm, before being used.

Subsequently, in the same manner as that described for the manufacturing methods above, any excess metals from group 1A, group 2A, group 3A, group 1B, group 2B, group 3B, group 4A, group 5A, group 6A, or group 8 are removed by washing, and the clathrate compound then formed by pressure sintering.

It should be noted that in the manufacturing processes described above, mechanical alloying treatments or mechanical grinding treatments can be employed in the grinding process to produce a mixed powder of the target constituent ratio. Mechanical alloying treatments or mechanical grinding treatments are methods in which the powders for grinding are placed inside a hollow atreiter which contains a plurality of metallic spheres made of stainless steel or the like, and the atreiter is then rotated at high speed, and the high energy used to grind and mix the powder between the metallic spheres to produce a powdered mixture of a uniform composition. In the case of mechanical grinding treatment, a powdered mixture can be obtained, but in many cases the fine particles comprising the finely ground powdered mixture intermesh forming fine granules of a uniform system, producing a system just like an alloy. This type of process is known as mechanical alloying. By taking the fine powder which has been obtained by mechanical alloying treatment and in which the atoms are bound closely together, and submitting the powder to heat treatment and then hot pressing, a clathrate compound can be obtained very simply.

WORKING EXAMPLES

As follows is a more detailed description of the present invention with reference to working examples, although the present invention is in no way limited to the following examples.

Example 1

Powders of Ba, Si and Al were weighed and combined to produce a Ba:Si:Al constituent ratio (atom %) of 8:26:20, and a powdered mixture then prepared by mechanical alloying treatment. The powdered mixture was submitted to preliminary heating at 800° C. under an atmosphere of Ar gas for a period of 24 hours, and following this preliminary heating, was then re-ground to an average granular diameter of 100 μm, before undergoing plasma sintering in a plasma sintering apparatus at a temperature of 850° C. and a pressure of 40 MPa for a period of 30 minutes.

X-ray analysis of the sintered product confirmed a silicon clathrate 46 $Ba_8@(Si_{26},Al_{20})$ structure in the space group Pm3m, origin at 4 3m (note that normally in crystallographic analyses the "3" of Pm3m is displayed with an overline, but here the overline is represented by 3), and with a lattice constant of 10.3 Å. Furthermore, a measurement of the figure of merit (ZT) of the sintered product at 700K confirmed a value greater than 1, of 1.01. This intercalant compound is usable as a thermoelectric material.

Example 2

Powders of Ba, Si and P were weighed and combined to produce a Ba:Si:P constituent ratio (atom %) of 8:26:20, and a powdered mixture then prepared by mechanical alloying treatment. The powdered mixture was submitted to preliminary heating at 800° C. under an atmosphere of Ar gas for a period of 24 hours, and following this preliminary heating, was then re-ground to an average granular diameter of 100 μm, before undergoing plasma sintering in a plasma sintering apparatus at a temperature of 850° C. and a pressure of 40 MPa for a period of 30 minutes.

X-ray analysis of the sintered product confirmed a silicon clathrate 46 $Ba_8@(Si_{26},P_{20})$ structure in the space group Pm3m, origin at 4 3m (note that normally in crystallographic analyses the "3" of Pm3m is displayed with an overline, but here the overline is represented by 3), and with a lattice constant of 10.5 Å. Furthermore, a measurement of the figure of merit (ZT) of the sintered product at 700K confirmed a value greater than 1, of 1.05. This intercalant compound is usable as a thermoelectric material.

Next, by constructing a thermoelectric module from an n-type thermoelectric element constructed from the silicon clathrate 46 $Ba_8@(Si_{26},P_{20})$ thermoelectric material obtained in example 2 and a p-type thermoelectric element constructed from the silicon clathrate 46 $Ba8@(Si_{26},Al_{20})$ thermoelectric material obtained in example 1, a thermoelectric module with superior thermoelectric efficiency was obtained.

Example 3

Calcium carbide ($CaC_2$) was melted by heating at up to 2,500° C., and following solidification was insulated inside a furnace and cooled gradually to 1,000° C. The furnace was then maintained at a temperature of 1,000±10° C. for a period of 120 hours (5 days). The resulting ingot was ground finely and washed with water. Following drying, the powder was inserted into a pressure sintering apparatus and sintered for 20 hours at 1000° C. and 100 MPa. Structural analysis of the crystals obtained, by X-ray diffraction, revealed a lattice constant of 0.68 nm, and the diffraction peaks confirmed the encapsulation of Ca atoms within clusters of 20 carbon atoms and clusters of 24 carbon atoms. Composition analysis by EPMA showed a Ca:C atomic weight ratio of 7.62:45.62 as opposed to the target Ca:C ratio of 8:46. Furthermore the results of a hardness test revealed a hardness equivalent to cubic boron nitride. Moreover, confirmation of the current direction using hot-probe methods, confirmed an n-type semiconductor.

Example 4

Barium silicide ($BaSi_2$) was ground, using a ball mill in an inert atmosphere, to a fine powder with a granular diameter of no more than 100 μm. The barium silicide powder and a fine powder of aluminium with a granular diameter of no more than 100 μm were then dispersed and spread in a very thin film on the surface of a sample bowl made of alumina, and then placed in a heating furnace under an inert atmosphere and held at a temperature of 850° C.±10° C. for a period of 150 hours (approximately 6 days). Next, the fine powder was cooled and washed with water. Following drying, the fine powder was inserted into a pressure sintering apparatus and sintered for 30 minutes at 850° C. and 400 MPa. Structural analysis of the crystals obtained, by X-ray diffraction, revealed a lattice constant of 1.04 nm, and confirmed a barium-silicon clathrate of a $Si_{46}$ structure with a crystallographic space group of Pm3(bar)m. Composition analysis by EPMA showed a Ba:Si:Al atomic weight ratio of 7.5:23.5:22.5. Moreover, confirmation of the current direction using hot-probe methods, confirmed a p-type semiconductor.

Example 5

An intercalant graphite intercalation compound ($CaC_6$) incorporating calcium (Ca) was ground, using a ball mill in an inert atmosphere, to a fine powder with a granular diameter of no more than 100 μm. The fine powder of the calcium incorporated graphite intercalation compound was then dispersed and spread in a very thin film on the surface of a sample bowl made of alumina, and then placed in a heating furnace under an inert atmosphere and held at a temperature of 1200° C.±20° C. for a period of 150 hours (approximately 6 days). Next, the fine powder was cooled, washed with water, and then further washed with dilute hydrochloric acid. Following drying, the fine powder was inserted into a pressure sintering apparatus and sintered for 20 hours at 1000° C. and 40 MPa. Structural analysis of the crystals obtained, by X-ray diffraction, revealed a lattice constant of 0.68 nm, and confirmed a calcium-carbon clathrate structure with a crystallographic space group of Pm3(bar)m. Composition analysis by EPMA showed a Ca:C atomic weight ratio of 6.5:46 as opposed to the target Ca:C ratio of 8:46. Moreover, confirmation of the current direction using hot-probe methods, confirmed an n-type semiconductor.

Example 6

Calcium carbide ($CaC_2$) was melted by heating at up to 2,500° C., and following solidification was insulated inside a furnace and cooled gradually to 700° C. The furnace was then maintained at a temperature of 700±10° C. for a period of 120 hours (5 days). The resulting ingot was ground finely to a granular diameter of approximately 100 μm and then washed with water. Following drying, the powder was inserted into a pressure sintering apparatus and sintered for 20 hours at 1000° C. and 100 MPa. Structural analysis of the crystals obtained, by X-ray diffraction, revealed a lattice constant of 0.95 nm, and the diffraction peaks confirmed the encapsulation of Ca atoms within clusters of 20 carbon atoms and clusters of 28 carbon atoms. Composition analysis by EPMA showed a Ca:C atomic weight ratio of 4.6:33.5 as opposed to the target Ca:C ratio of 6:34. Furthermore the results of a hardness test revealed a hardness equivalent to cubic boron nitride. Moreover, confirmation of the current direction using hot-probe methods, revealed an n-type semiconductor.

Example 7

Calcium carbide ($CaC_2$) was ground, using a ball mill in an inert atmosphere (argon atmosphere), to a fine powder with a granular diameter of no more than 100 μm. The calcium carbide ($CaC_2$) powder and a fine powder of aluminium with a granular diameter of no more than 100 μm were then dispersed and spread in a very thin film on the surface of a sample bowl made of alumina, and then placed in a heating furnace under an inert atmosphere and held at a temperature of 70° C.±10° C. for a period of 120 hours (5 days). Next, the fine powder was cooled and washed with water. Following drying, the fine powder was inserted into a pressure sintering apparatus and sintered for 30 minutes at 850° C. and 40 MPa. Structural analysis of the crystals obtained, by X-ray diffraction, revealed a lattice constant of 1.04 nm, and confirmed a calcium-aluminium-carbon clathrate structure with a crystallographic space group of Fd3(bar)m with an origin at center 3(bar)m. Composition analysis by EPMA showed a Ca:Al:C atomic weight ratio of 5.5:23.4:22.6. Moreover, confirmation of the current direction using hot-probe methods, confirmed an n-type semiconductor.

Example 8

Barium silicide ($BaSi_2$) was melted by heating at up to 1,200° C., and following solidification was insulated inside a furnace and cooled gradually to 300° C. The furnace was then maintained at a temperature of 300±10° C. for a period of 120 hours (5 days). The resulting ingot was ground finely to a granular diameter of approximately 100 μm and then washed with water. Following drying, the powder was inserted into a pressure sintering apparatus and sintered for 20 hours at 1000° C. and 50 MPa. Structural analysis of the crystals obtained, by X-ray diffraction, revealed a lattice constant of 0.95 nm, and the diffraction peaks confirmed the encapsulation of Ba atoms within silicon clusters of 20 silicon atoms and silicon clusters of 28 silicon atoms. Composition analysis by EPMA showed a Ba:Si atomic weight ratio of 4.6:33.5 as opposed to the target Ba:Si ratio of 6:34. Furthermore the results of a hardness test revealed a hardness equivalent to cubic boron nitride. Moreover, confirmation of the current direction using hot-probe methods, revealed an n-type semiconductor.

What is claimed is:

1. A clathrate compound comprising a clathrate lattice with atoms of at least one element selected from the group consisting of silicon and carbon as a main structure, doping atoms which are encapsulated within lattice spacings of said clathrate lattice, and substitution atoms which are substituted for at least one portion of atoms which make up said clathrate lattice, wherein said clathrate lattice is one clathrate selected from the group consisting of:

i) a silicon clathrate 46 (Si46) mixed lattice of a Si20 cluster comprising a dodecahedron of Si atoms and a Si24 cluster comprising a tetradecahedron of Si atoms;

ii) a silicon clathrate 34 (Si34) mixed lattice of a Si20 cluster comprising a dodecahedron of Si atoms, and a Si28 cluster comprising a hexadecahedron of Si atoms;

iii) a carbon clathrate 46 (C46) mixed lattice of a C20 cluster comprising a dodecahedron of C atoms, and a C24 cluster comprising a tetradecahedron of C atoms; and iv) a carbon clathrate 34 (C34) mixed lattice of a C20 cluster comprising a dodecahedron of C atoms, and a C28 cluster comprising a hexadecahedron of C atoms;

said doping atoms are atoms of at least one element selected from the group consisting of Li, Na, K, Rb, Cs, Fr, Be, Mg, Ca, Sr, Ba, Ra, Sc, Y, La, Ce, Pr, Nd, Sm, Eu, Gd, Tb, Dy, Ho, Er, Tm, Yb, Lu, Ac, Th, Pa, U, Cu, Ag, Au, Zn, Cd, Hg, B, Al, Ga, In, Tl, Ti, Zr, Hf, V, Nb, Ta, Cr, Mo, W, Fe, Co, Ni, Ru, Rh, Pd, Os, Ir, and Pt; and and said substitution atoms are atoms of at least one element selected from the group consisting of Li, Na, K, Rb, Cs, Fr, Be, Mg, Ca, Sr, Ba, Ra, Sc, Y, La, Ce, Pr, Nd, Sm, Eu, Gd, Th, Dy, Ho, Er, Tm, Yb, Lu, Ac, Th, Pa, U, Cu, Ag, Au, Zn, Cd, Hg, B, Al, Ga, In, Tl, V, Nb, Ta, Cr, Mo, W, Mn, Re, N, P, As, Sb, Bi, O, S, Se, Te, Po, F, Cl, Br, I, At, Fe, Co, Ni, Ru, Rh, Pd, Os, Ir, and Pt.

2. A clathrate compound according to claim 1, wherein said doping atoms have a greater mass than said atoms which make up said clathrate lattice.

3. A clathrate compound according to claim 1, wherein said doping atoms have a smaller electronegativity than said atoms which make up said clathrate lattice.

4. A method of manufacturing a clathrate compound of claim 1, wherein an elementary substance of atoms required for constructing said clathrate lattice, an elementary substance of said doping atoms, and an elementary substance of said substitution atoms are mixed together in a predetermined ratio, and following pressure formation into a desired form, are subjected to preliminary heat treatment, and then sintered using pressure sintering techniques.

5. A method of manufacturing a clathrate compound of claim 1, wherein a compound of silicon or carbon which incorporates at least one element to become said doping atoms and said substitution atoms is melted in an inert atmosphere, and following solidification, is cooled gradually, maintained at a temperature of at least 500° C. for a period of at least 10 hours, and is then cooled further, before being washed to remove any excess doping atoms and substitution atoms, and subsequently pressure sintered.

6. A method of manufacturing a clathrate compound of claim 1, wherein a compound of silicon or carbon which incorporates at least one element to become said doping atoms and said substitution atoms is crushed, in an inert atmosphere, to a powder with a granular diameter of no more than 100 $\mu$m, and is then spread into a film inside a heat resistant vessel, and following heating at a temperature of at least 500° C. for a period of at least 10 hours, is then cooled, washed to remove any excess doping atoms and substitution atoms, and subsequently pressure sintered.

7. A method of manufacturing a clathrate compound of claim 1, wherein a fine powder of an intercalant graphite intercalation compound with a granular diameter of no more than 100 $\mu$m and incorporating at least one element to become said doping atoms and said substitution atoms is spread into a film inside a heat resistant vessel, and following heating at a temperature of at least 500° C. for a period of at least 10 hours, is then cooled, washed to remove any excess doping atoms and substitution atoms, and subsequently pressure sintered.

* * * * *

UNITED STATES PATENT AND TRADEMARK OFFICE
CERTIFICATE OF CORRECTION

PATENT NO. : 6,461,581 B1
DATED : October 8, 2002
INVENTOR(S) : Haruki Eguchi et al.

It is certified that error appears in the above-identified patent and that said Letters Patent is hereby corrected as shown below:

Column 13,
Line 49, please delete "$Z_{pn} = (\alpha_p-\alpha_n)^2/(\kappa_p\rho_p+\kappa_n\rho_n)$", and insert therefor -- $Z_{pn} = (\alpha_p-\alpha_n)^2/(\kappa_p\rho_p+\kappa_n\rho_n)^2$ --.

Column 26,
Line 63, please delete "Th,", and insert therefor -- Tb, --.

Signed and Sealed this

Eleventh Day of March, 2003

JAMES E. ROGAN
*Director of the United States Patent and Trademark Office*